(12) United States Patent
Miya

(10) Patent No.: US 8,857,449 B2
(45) Date of Patent: Oct. 14, 2014

(54) SUBSTRATE PROCESSING APPARATUS AND SUBSTRATE PROCESSING METHOD

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1641 days.

(21) Appl. No.: 11/689,073

(22) Filed: Mar. 21, 2007

(65) Prior Publication Data

US 2007/0227566 A1    Oct. 4, 2007

(30) Foreign Application Priority Data

Mar. 30, 2006  (JP) ................. 2006-095041

(51) Int. Cl.
*B08B 3/00*    (2006.01)
*H01L 21/67*   (2006.01)

(52) U.S. Cl.
CPC .............. *H01L 21/67051* (2013.01)
USPC ....................................... 134/95.2

(58) Field of Classification Search
USPC ............... 134/95.2; 118/123, 261; 427/356; 15/256.51
See application file for complete search history.

(56) References Cited

U.S. PATENT DOCUMENTS

| | | | |
|---|---|---|---|
| 3,928,125 A * | 12/1975 | Poeschl .................. | 162/352 |
| 6,446,358 B1 | 9/2002 | Mitsumori et al. | |
| 7,387,455 B2 | 6/2008 | Awamura et al. | |
| 2005/0145265 A1* | 7/2005 | Ravkin et al. ............ | 134/21 |
| 2005/0223980 A1 | 10/2005 | Awamura et al. | |

FOREIGN PATENT DOCUMENTS

| | | |
|---|---|---|
| JP | 10-321587 | 12/1998 |
| JP | 2001-33165 | 2/2001 |
| JP | 2003-68702 | 3/2003 |
| JP | 2003-109929 | 4/2003 |
| JP | 2003-151947 | 5/2003 |
| JP | 2004-14869 | 1/2004 |
| JP | 2004-335840 | 11/2004 |
| JP | 2005-131602 | 5/2005 |
| JP | 2006-66579 | 3/2006 |

OTHER PUBLICATIONS

U.S. Appl. No. 11/687,381, filed Mar. 16, 2007.
Office Action issued Apr. 15, 2010 in related U.S. Appl. No. 11/687,381 of Katsuhiko Miya, filed Mar. 16, 2007, which includes, at pp. 5-6, a nonstatutory obviousness-type double patenting rejection over certain claims of the present application.
Japanes Office Action isssued Sep. 14, 2010 in connection with corressponding Japanese Patent Application No. 2006-095041.

* cited by examiner

*Primary Examiner* — David Cormier
(74) *Attorney, Agent, or Firm* — Ostrolenk Faber LLP

(57) ABSTRACT

A rinsing liquid adheres in a piled up state to the entire front surface of the substrate which is rinsed with the rinsing liquid discharged from a rinse nozzle, thereby forming a so-called puddle-like rinse layer. An opposed surface of a proximity block is positioned in the vicinity of a front surface of a substrate and a liquid-tight layer is formed in a gap space between the opposed surface and the front surface of the substrate. In a condition that the liquid-tight layer is formed, the proximity block moves in the moving direction, and a solvent gas containing a solvent component, which dissolves in the liquid to reduce a surface tension, is supplied toward an upstream-side edge of the liquid-tight layer.

17 Claims, 12 Drawing Sheets

FIG. 6A : BEFORE PROXIMITY BLOCK MOVES
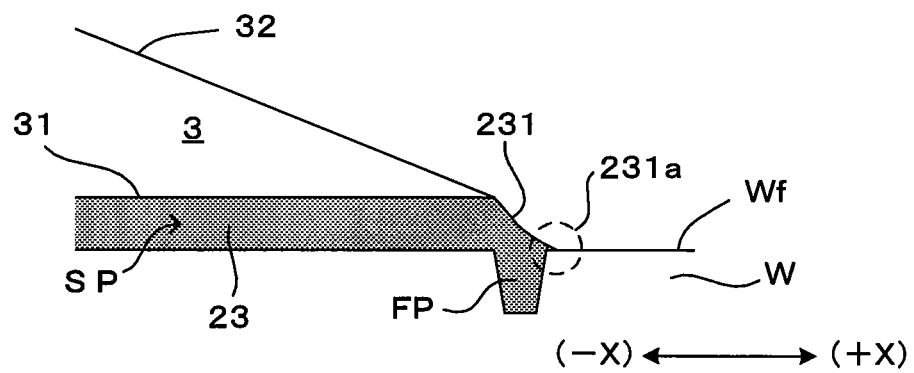
FIG. 6B : AFTER PROXIMITY BLOCK MOVES
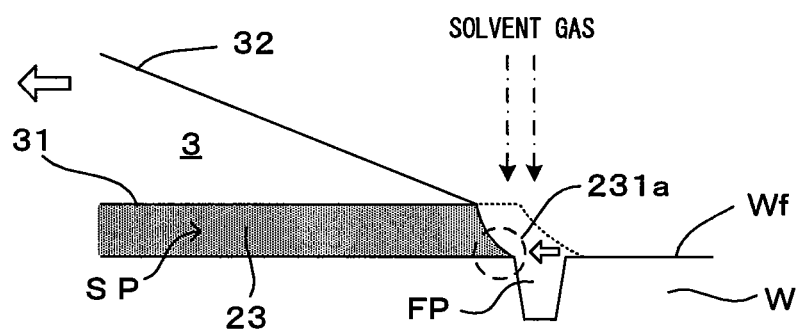

SUBSTRATE PROCESSING APPARATUS AND SUBSTRATE PROCESSING METHOD

CROSS REFERENCE TO RELATED APPLICATION

The disclosure of Japanese Patent Application No. 2006-095041 filed Mar. 30, 2006 including specification, drawings and claims is incorporated herein by reference in its entirety.

BACKGROUND OF THE INVENTION

1. Field of the Invention

The present invention relates to a substrate processing apparatus for and a substrate processing method of drying a surface of a substrate which is wet with a liquid. Substrates to be dried include semiconductor wafers, glass substrates for photomask, glass substrates for liquid crystal display, glass substrates for plasma display, substrates for optical disks, etc.

2. Description of the Related Art

Numerous drying methods have already been proposed in an attempt to remove a rinsing liquid adhering as a liquid film to the top surface of a substrate after cleaning with a processing liquid and rinsing with the rinsing liquid such as deionized water. One well known method among these is a drying method utilizing the Marangoni effect. This drying method is a method which dries a substrate by means of convective flows (Marangoni convection) caused from a surface tension difference. Particularly for a substrate processing apparatus of the single wafer processing, the so-called Rotagoni drying is known, which is a combination of drying utilizing the Marangoni effect and the spin drying.

In the Rotagoni drying, IPA (isopropyl alcohol) vapor and deionized water are discharged respectively from associated nozzles upon a rotating substrate from above the center of the substrate. Drying starts in an area provided with the EPA vapor, and as these nozzles gradually move toward outside in the radial direction of the substrate, the dried region spreads from the center of the substrate toward the rim thereof, and then the entire substrate is dried. In short, drying is attained as the deionized water on the substrate is removed off from the substrate due to the function of centrifugal force attributed to the rotation of the substrate and the Marangoni effect caused by discharging of the IPA vapor.

As other substrate drying method utilizing the Marangoni effect, the drying method described in JP-A-10-321587 is known. A substrate processing apparatus which performs this drying method is an apparatus which dries a substrate while plural rollers transport a cleaned and rinsed substrate. In this apparatus, a partition plate and a drainage block are arranged in series along a substrate transportation path. Hence, when a substrate on which water droplets adhere is conveyed to the partition plate, the partition plate removes most of the water droplets. While the substrate is conveyed further to the drainage block after this, due to a narrow clearance between thus transported substrate and the drainage block, water droplets which have slipped through the partition plate get diffused in the width direction of the drainage block owing to the capillary phenomenon. In addition, on the exit side of the drainage block, an inert gas containing an IPA gas is supplied toward the surface of the substrate. The supply of the gas gives rise to the Marangoni effect, whereby remaining water droplets evaporate and dry.

SUMMARY OF THE INVENTION

By the way, while patterns formed on the surface of the substrate have become finer rapidly in recent years, which has raised new problems in the substrate processing field. That is, during drying, a problem arises that fine patterns are drawn toward each other and collapse. To be more specific, an interface between a liquid and a gas appears on the substrate with the progress of drying, and this is a problem that a negative pressure to occur in clearances between fine patterns pull the patterns to each other so that the patterns are collapsed. This negative pressure to occur in the clearances between the patterns is dependent upon a surface tension of the liquid and becomes larger as the surface tension of the liquid increases. Hence, for drying of a substrate wet with deionized water, use of a fluid whose surface tension is smaller than that of deionized water, IPA for instance, is effective in preventing destruction of patterns.

However, since a substrate is dried while rotating the substrate in the Rotagoni drying, there is the following problem. In particular, even IPA vapor is supplied to a surface of a substrate, the EPA vapor gets ejected off from the substrate immediately due to an influence of air flows generated by the rotation of the substrate, thereby making it impossible to sufficiently dissolve IPA in deionized water adhering to the surface of the substrate. As a result, it is impossible to sufficiently reduce the surface tension of the liquid (deionized water+EPA) adhering to the surface of the substrate and it is difficult to ensure a sufficient effect of prevention of pattern destruction.

Further, in the Rotagoni drying, due to the function of centrifugal force attributed to the rotation of the substrate and the Marangoni effect caused by discharging the IPA vapor, a dried region spreads from the center of the substrate toward the rim thereof, whereby the substrate is dried. Hence, two types of force, namely, the centrifugal force and the force generated by the Marangoni convection, act upon the deionized water adhering to the surface of the substrate. However, it is difficult to control the balance between the two types of force in the Rotagoni drying, which virtually makes it impossible to control the gas-liquid-solid interface. It is therefore impossible to move the gas-liquid-solid interface in one direction (toward outside in the radial direction) at an even speed. Hence, drying defects such as a water mark which is generated by the fact that the dried substrate surface region is wetted again has occurred in some cases.

On the other hand, according to the drying method described in JP-A-10-321587, although the inconvenience above associated with rotations of a substrate will not occur, the following problem may arise. That is, after the partition plate scrapes off and removes most of water droplets adhering to the surface of the substrate, water droplets remaining on the surface of the substrate are sent to the location of the drainage block. Hence, there exist water droplets in patches among the area from which water droplets are removed to be dried, on the surface of the substrate after most of water droplets has been scraped off and removed by the partition plate. Small droplets among such water droplets in patches are dried not by the Marangoni effect but by natural seasoning. Especially in the case where the remaining amount of water droplets is little, it happens that the entire surface of the substrate between the drainage block and the surface of the substrate is not covered with the water droplets. As a result, there occurs an area which is dried not by the Marangoni effect but by natural seasoning on the surface of the substrate. When the surface of the substrate dries by natural seasoning in this manner, an elution substance which has eluted into the remaining water droplets separates out during natural seasoning. Therefore, there has been a problem that the elution substance which has separated out becomes a watermark and leads to dry defects.

The invention has been made in light of the problems above, and accordingly, an object of the invention is to provide a substrate processing apparatus for and a substrate processing method of favorably drying a surface of a substrate during drying of the surface of the substrate wet with a liquid while preventing destruction of patterns formed on the surface of the substrate.

According to a first aspect of the present invention, there is provided a substrate processing apparatus which dries a surface of a substrate which is wet with a liquid, the apparatus comprising: a proximity member which includes an opposed surface facing the surface of the substrate and which is structured to move freely and relatively in a predetermined moving direction relative to the substrate in a condition that the opposed surface is positioned away from the surface of the substrate and that a gap space between the opposed surface and the surface of the substrate is filled up with the liquid to form a liquid-tight layer; a driver which relatively moves the proximity member in the moving direction relative to the substrate; a solvent gas supplier which supplies a solvent gas toward an upstream-side end portion of the liquid-tight layer in the moving direction, the solvent gas necessarily containing a solvent component which dissolves in the liquid to reduce a surface tension; and a liquid layer forming section which forms a puddle-like liquid layer on an entire downstream-side surface of the substrate relative to the upstream-side end portion of the liquid-tight layer in the moving direction.

According to a second aspect of the present invention, there is provided a substrate processing method of drying a surface of a substrate which is wet with a liquid, the method comprising the steps of: forming a liquid-tight layer in a gap space, the liquid-tight layer being a layer filled up with the liquid, the gap space being a space which is formed by arranging a proximity member which includes an opposed surface facing the surface of the substrate in such a manner that the opposed surface is spaced apart from the surface of the substrate, and accordingly a space between the opposed surface and the surface of the substrate; moving the proximity member relatively in a predetermined moving direction relative to the substrate while maintaining a condition that the liquid-tight layer is formed; supplying a solvent gas toward an upstream-side end portion of the liquid-tight layer in the moving direction, the solvent gas necessarily containing a solvent component which dissolves in the liquid to reduce a surface tension; and forming a puddle-like liquid layer on an entire downstream-side surface of the substrate relative to the upstream-side end portion of the liquid-tight layer in the moving direction.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 6A and 6B are diagrams which show drying operation by a movement of the proximity block.

DETAILED DESCRIPTION OF THE PREFERRED EMBODIMENTS

<First Embodiment>

Figure 1:
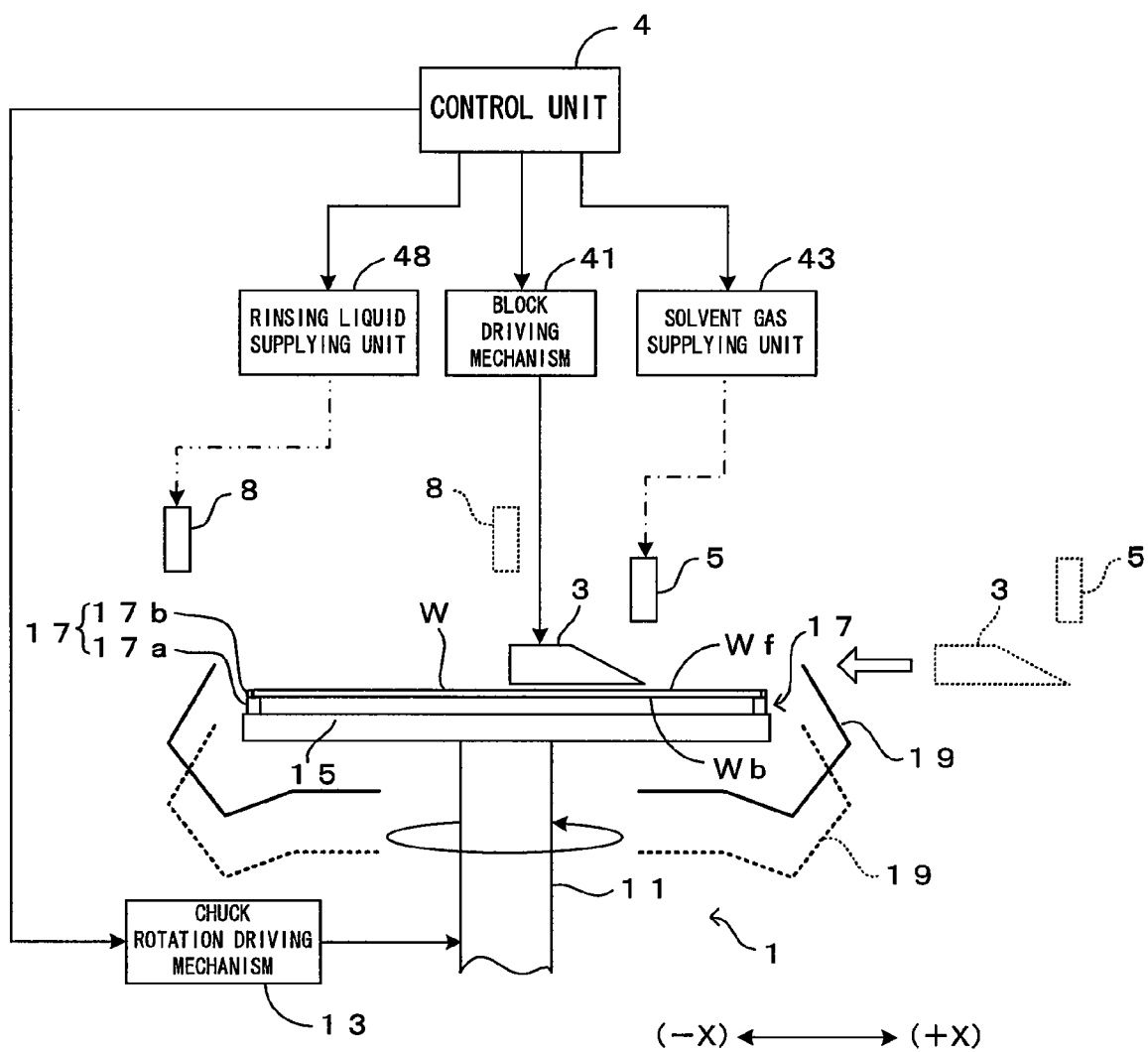
FIG. 1 is a diagram showing a substrate processing apparatus according to a first embodiment of the invention.
Figure 2A:
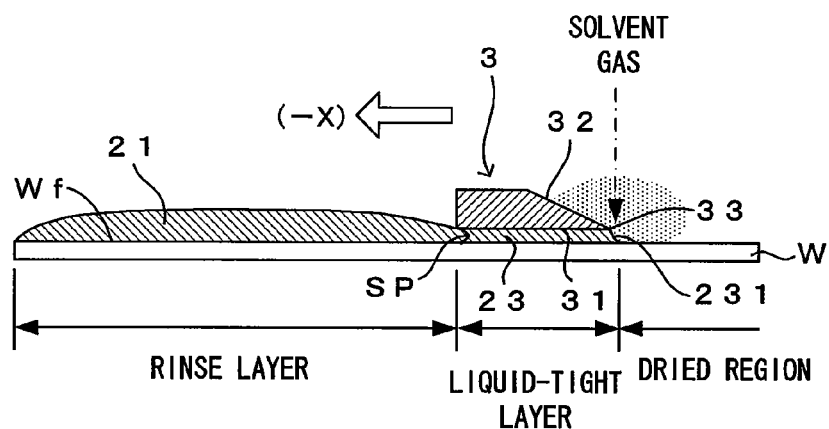
FIG. 2A is a partial side view of the substrate processing apparatus shown in FIG. 1.
Figure 2B:
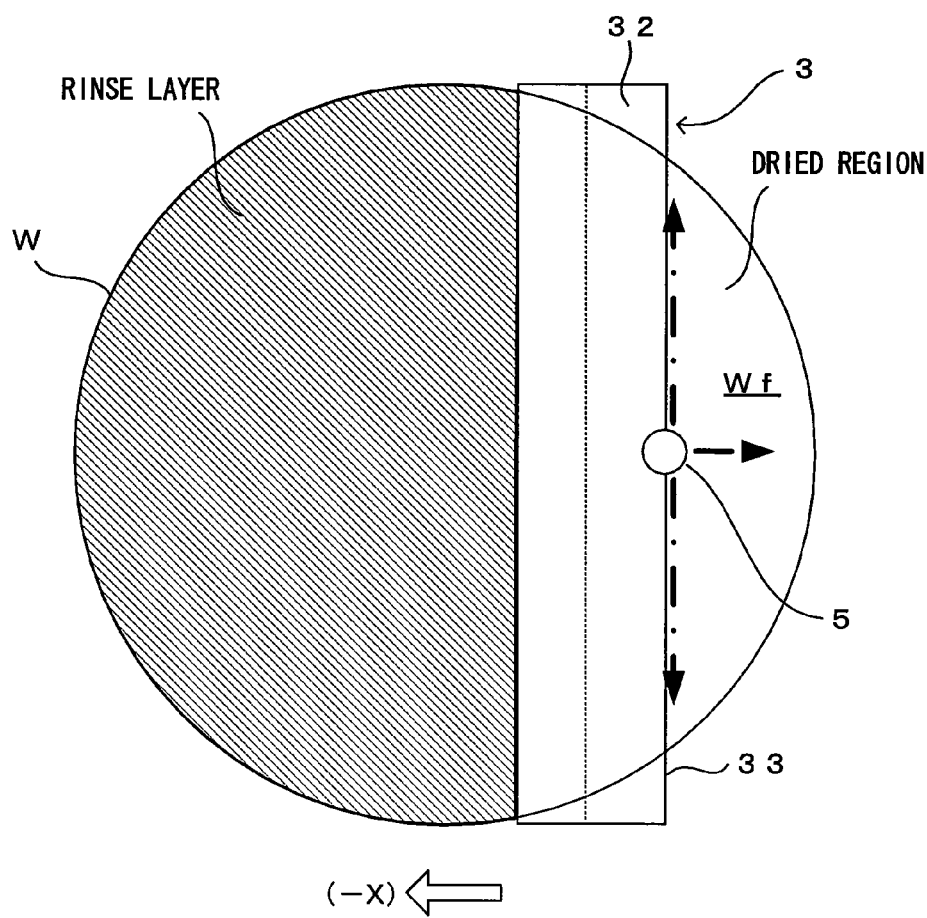
FIG. 2B is a plan view of the substrate processing apparatus shown in FIG. 2A.

FIG. 1 is a diagram showing the substrate processing apparatus according to the first embodiment of the invention. FIGS. 2A and 2B are partially enlarged views of the substrate processing apparatus shown in FIG. 1. To be more precise, FIG. 2A is a partial side view of the substrate processing apparatus, while FIG. 2B is a plan view of the substrate processing apparatus shown in FIG. 2A. This substrate processing apparatus is a substrate processing apparatus of the single wafer processing which is used for cleaning process to remove contaminants adhering to the front surface Wf of a substrate W such as a semiconductor wafer. Describing this in more detail, this is an apparatus which dries a rinsed substrate W after chemical processing with a chemical solution and rinsing with a rinsing liquid such as purified water and DIW (deionized water) of the front surface Wf of the substrate W on which patterns are formed. In this substrate processing apparatus, on the substrate W which is rinsed finally, the rinsing liquid adheres to the entire front surface Wf of the substrate to form a so-called puddle-like rinse layer 21, and drying is executed in this state.

This substrate processing apparatus comprises a spin chuck 1, a proximity block 3, a solvent gas nozzle 5 and a rinse nozzle 8. The spin chuck 1 holds a substrate W horizontally such that the front surface Wf of the substrate W is directed toward above and rotates the substrate W. The proximity block 3 is disposed facing the substrate W which is held by the spin chuck but away from the substrate W. The solvent gas nozzle 5 discharges a solvent gas from above the substrate W. The rinse nozzle 8 discharges a rinsing liquid toward the front surface Wf of the substrate.

A rotation column 11 of the spin chuck 1 is linked to a rotation shaft of a chuck rotation driving mechanism 13 which contains a motor. The spin chuck 1 is rotatable about a vertical axis when driven by the chuck rotation driving mechanism 13. A disk-shaped spin base 15 is linked by a fastening component such as a screw to a top end portion of the rotation column 11 as one integrated unit. The spin base 15 therefore rotates about the vertical axis when driven by the chuck rotation driving mechanism 13 in response to an operation command received from a control unit 4 which controls the apparatus as a whole.

Plural chuck pins 17 for holding the substrate W at the rim thereof are disposed upright in the vicinity of the rim of the spin base 15. There may be three or more chuck pins 17 to securely hold the disk-shaped substrate W, and the chuck pins 17 are arranged at equal angular intervals along the rim of the spin base 15. Each chuck pin 17 comprises a substrate support part 17a which supports the substrate W at the rim thereof from below and a substrate holding part 17b which presses the substrate W at the outer peripheral edge surface thereof to hold the substrate W Each chuck pin 17 is structured s o as to be capable of switching between a pressing state that the substrate holding part 17b presses the substrate W at the outer peripheral edge surface thereof and a released state that the substrate holding part 17b stays away from the outer peripheral edge surface of the substrate W.

The plural chuck pins 17 are in the released state while the substrate W is being transferred to the spin base 15 but in the pressing state for cleaning of the substrate W. When in the pressing state, the plural chuck pins 17 hold the substrate W at the rim thereof and keep the substrate approximately horizontally at a predetermined distance from the spin base 15. The substrate W is held with its front surface (pattern-formed surface) Wf directed toward above and its back surface Wb toward below.

Further, for prevention of splashing of a chemical solution and a rinsing liquid around the substrate W during execution of chemical processing and rinsing of the substrate, a splashing preventing cup 19 is disposed around the spin base 15. In response to a control signal from the control unit 4, the splashing preventing cup 19 is driven to retract to a lower position (the position denoted at the dotted line in FIG. 1), which is below an upper position (the position denoted at the solid line in FIG. 1) at which the splashing preventing cup 19 can collect the chemical solution and the rinsing liquid, to avoid interfering with a substrate transporter (not shown) and the proximity block 3 while the substrate transporter is handing the substrate W to the spin base 15 and during drying of the front surface Wf of the substrate by the proximity block 3 in a manner described later.

Figure 3:
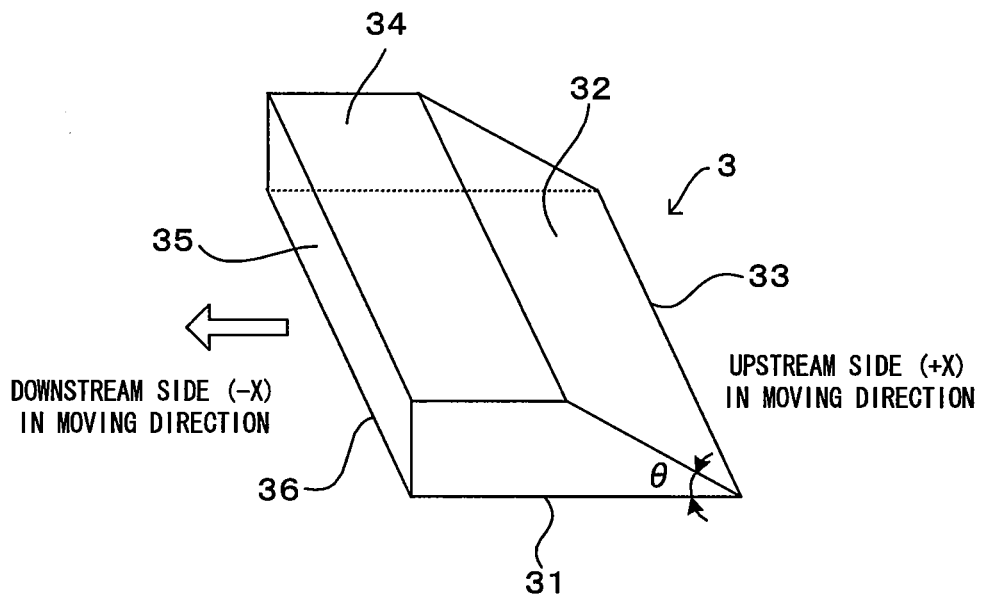
FIG. 3 is a perspective view of a proximity block.

FIG. 3 is a perspective view of the proximity block. The proximity block 3 serves as a "proximity member" of the invention and is in a shape of a right prism of which the vertical cross section is approximately a trapezoid. One side surface of the proximity block 3 is an opposed surface 31 which faces the front surface Wf of the substrate wet with the rinsing liquid. The proximity block 3 is disposed so as to freely move horizontally, and a block driving mechanism 41 is linked to the top and the bottom side portions of the proximity block 3 in FIG. 3. Hence, when the block driving mechanism 41 is operated in accordance with an operation command from the control unit 4, the proximity block 3 reciprocally moves in the horizontal direction X at a predetermined speed. That is, when the block driving mechanism 41 is operated, the proximity block 3 moves in the horizontal direction X from a retract position (the position denoted at the dotted line in FIG. 1), which is off to the side of the substrate W, thereby achieving drying described later of the entire surface of the substrate while the proximity block 3 closely facing the front surface Wf of the substrate.

In this embodiment, drying is performed with the proximity block 3 moving to the left-hand side (−X) in FIG. 3 in the horizontal direction X. This horizontal direction (−X) corresponds to a "predetermined moving direction" of the invention, and the horizontal direction (−X) will be hereinafter referred to simply as the "moving direction". Meanwhile, the block driving mechanism 41 may be a known mechanism, such as a feed screw mechanism which moves the proximity block 3 along a guide and a ball screw elongating in the horizontal direction X by driving a motor. In this embodiment, the block driving mechanism 41 thus functions as a "driver" of the invention.

Other side surface 32 of the proximity block 3 is a surface which is located on the upstream side (+X) in the moving direction and directed toward above. To be more precise, the side surface 32 is connected with an upstream side 33 which is one of sides defining the opposed surface 31 and which is located on the upstream side (+X) in the moving direction among the sides. And the side surface 32 extends inclined from the upstream side 33 in a direction away from the substrate surface Wf overlooking the upstream side (+X) in the moving direction. The side surface 32 corresponds to an "extending surface" of the invention. The upstream side 33 elongates in a direction (the up-down direction in FIG. 2B which will be hereinafter referred to as a "width direction") orthogonal to the moving direction. The length of the upstream side 33 in the width direction, namely, the length of the proximity block 3 in the width direction is approximately the same as the diameter of the substrate or longer. Hence, when the proximity block 3 moves in the moving direction, the entire front surface of the substrate can be processed. Meanwhile, at the upstream-side end portion of the proximity block 3, the opposed surface 31 and the side surface (extending surface) 32 are at an acute angle θ.

The proximity block 3 is arranged such that the opposed surface 31 is slightly spaced apart from the front surface Wf of the substrate and does not interfere with the substrate holding parts 17b of the chuck pins 17, and therefore, a part of the rinsing liquid which forms the rinse layer 21 adhering as a puddle to the front surface Wf of the substrate entirely fills up a gap space SP between the opposed surface 31 and the front surface Wf of the substrate due to the capillary phenomenon to form a liquid-tight layer 23. Such a proximity block 3 is preferably made of quartz from the standpoint that (1) the material is hydrophilic, (2) the material is required of cleanness, (3) the material must have a good workability, and so on.

The solvent gas nozzle 5 is disposed above the upstream side end portion of the proximity block 3. The solvent gas nozzle 5 supplies the solvent gas toward an end portion of the liquid-tight layer 23 at the upstream side (+X) thereof in the moving direction, that is, toward the upstream-side edge 231. The solvent gas nozzle 5 is connected with a solvent gas supplying unit 43. When the solvent gas supplying unit 43 is operated in response to an operation command received from the control unit 4, the solvent gas is pressure-fed to the solvent gas nozzle 5. As the solvent gas, a mixture of a solvent component and an inert gas such as a nitrogen gas is used, the solvent component getting dissolved in the rinsing liquid (whose surface tension is 72 dyn/cm when the rinsing liquid is deionized water) to reduce the surface tension, and being IPA (isopropyl alcohol) vapor (whose surface tension is 21 through 23 dyn/cm), for example. Meanwhile, the solvent component is not limited to IPA vapor, and vapors of various types of solvents such as ethyl alcohol and methyl alcohol may be used instead. The point is, any solvent component may be used which dissolves in the rinsing liquid to reduce the surface tension.

However, the solvent gas is preferably a gas containing IPA vapor as the solvent component, considering the safety, the price, etc. Further, the solvent gas may be vapor of such a solvent itself. However, in this embodiment, the solvent gas is a mixture of an inert gas such as a nitrogen gas and the solvent component, and accordingly the inert gas is used as a carrier. Hence, it is possible to surely send the solvent component to the substrate surface. Thus, according to this embodiment, the solvent gas nozzle 5 and the solvent gas supplying unit 43 function as a "solvent gas supplier" of the invention.

It is possible to supply the solvent gas to the entire upstream-side edge 231 of the liquid-tight layer 23 even with one such solvent nozzle 5 by diffusing the solvent gas in the width direction. However, it is possible to supply the solvent gas to the entire upstream-side edge 231 of the liquid-tight layer 23 evenly, when a plurality of nozzles are disposed in the width direction or a nozzle having a plurality of discharge holes arranged in the width direction is disposed.

Figure 4:
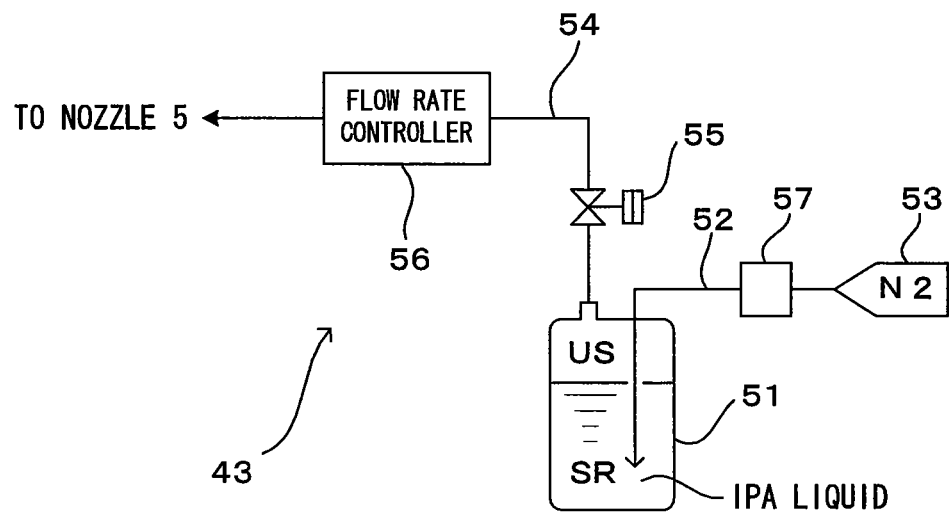
FIG. 4 is a diagram showing an example of a structure of a solvent gas supplying unit.

FIG. 4 is a diagram showing an example of a structure of the solvent gas supplying unit. The solvent gas supplying unit 43 comprises a solvent tank 51 which holds an IPA liquid as the solvent component. A reservoir area SR of the reservoir space inside the solvent tank 51 holding the IPA liquid is communicated with a nitrogen gas supplying section 53 via a pipe 52. Further, a non-reservoir area US of the reservoir space inside the solvent tank 51 not holding the IPA liquid is communicated with the solvent gas nozzle 5 via a pipe 54. Hence, as the nitrogen gas supplying section 53 pressure-feeds a nitrogen gas to the solvent tank 51, the IPA liquid bubbles up and IPA dissolves in the nitrogen gas, whereby the solvent gas (nitrogen gas+IPA vapor) is formed and appears in the non-reservoir area US. An on-off valve 55 and a flow rate controller 56 for the solvent gas are inserted in the pipe 54. When the nitrogen gas supplying section 53, the on-off valve 55 and the flow rate controller 56 are operated and controlled by the control unit, it is possible to control supply and discontinuation of supply of the solvent gas to the solvent gas nozzle 5. Further, in order to increase the concentration of the EPA vapor in the solvent gas, a temperature adjuster 57 may be inserted in the pipe 52 and the temperature of the nitrogen gas may be increased. This efficiently reduces the surface tension at the upstream-side edge 231 of the liquid-tight layer 23 and accelerates the drying. Meanwhile, temperature adjustment of the nitrogen gas may be replaced with temperature adjustment of the EPA liquid which is held inside the solvent tank 51. However, temperature adjustment to warm up the solvent gas itself appearing in the non-reservoir area US is not preferable since this facilitates elution of eluting materials into the rinsing liquid from the front surface Wf of the substrate.

The solvent gas nozzle 5 is structured so as to move in the moving direction in synchronization to the proximity block 3. That is, a link mechanism (not shown) links the solvent gas nozzle 5 with the proximity block 3. And when the block driving mechanism 41 is operated, the proximity block 3 and the solvent gas nozzle 5 move as one integrated unit in the moving direction. This ensures that the interval between the proximity block 3 and the discharging position of the solvent gas is maintained at a predetermined distance while the proximity block 3 moves. As a result, the physical properties (the velocity of flow, the flow volume, etc.) of the solvent gas discharged to the upstream-side edge 231 of the liquid-tight layer 23 become stable, which in turn realizes stable drying. Meanwhile, an independent driver may be disposed in the solvent gas nozzle 5 so that the solvent gas nozzle 5 moves in conjunction with the proximity block 3. However, it is possible to simplify the drive structure when the single driver moves the solvent gas nozzle 5 and the proximity block 3 as one integrated unit.

The rinse nozzle 8 for a supply of rinsing liquid is disposed at the upper position above the substrate W. The rinse nozzle 8 is movable between a processing position (the position denoted at the dashed line in FIG. 1) which corresponds approximately to the center of the substrate W and a retract position (the position denoted at the solid line in FIG. 1) which is off the substrate W. A rinsing liquid supplying unit 48 is connected to this rinse nozzle 8. The rinsing liquid supplying unit 48 is activated based upon the operation command from the control unit 4 and pressure-feeds the rinsing liquid to the rinse nozzle 8. In this way, the rinsing liquid is supplied to the front surface Wf of the substrate from the rinse nozzle 8 and the rinsing is executed. Then, after the execution of the rinsing, the rinsing liquid adheres to the entire front surface Wf of the substrate to form a so-called puddle-like rinse layer 21. Thus, according to this embodiment, the rinsing corresponds to a "wet processing" of the invention, and the rinse nozzle 8 and the rinsing liquid supplying unit 48 function as a "liquid layer forming section" and a "wet processor" of the invention.

Figure 5A:
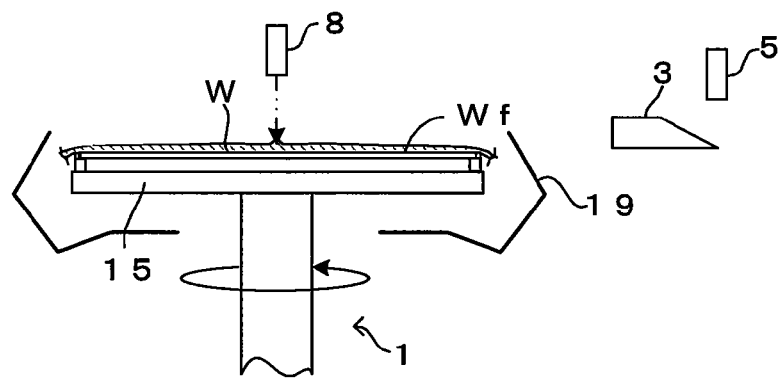
FIGS. 5A through 5D are schematic diagrams showing an operation of the substrate processing apparatus shown in FIG. 1.

A drying operation of the substrate processing apparatus having the structure above will now be described with reference to FIGS. 5A through 5D and 6A and 6B. FIGS. 5A through 5D are schematic diagrams showing an operation of the substrate processing apparatus shown in FIG. 1. FIGS. 6A and 6B are diagrams which show drying operation by a movement of the proximity block. Upon loading of the unprocessed substrate W into inside the apparatus by the substrate transporter (not shown), the control unit 4 aligns the splashing preventing cup 19 to the upper position (the position denoted at the solid line in FIG. 1) around the spin base 15, and executes cleaning (chemical processing+rinsing+drying) of the substrate W. First, after the chemical solution is supplied to the substrate W and predetermined chemical processing is carried out, rinsing of the substrate W is executed. That is, as shown in FIG. 5A, the rinsing liquid is fed to the front surface Wf of the substrate from the rinse nozzle 8 which is disposed at the processing position (the position denoted at the dashed line in FIG. 1) which corresponds approximately to the center of the substrate W and the substrate W is rotated by driving the chuck rotation driving mechanism 13, whereby the rinsing liquid spreads by the centrifugal force and the entire front surface Wf of the substrate is rinsed.

Figure 5B:
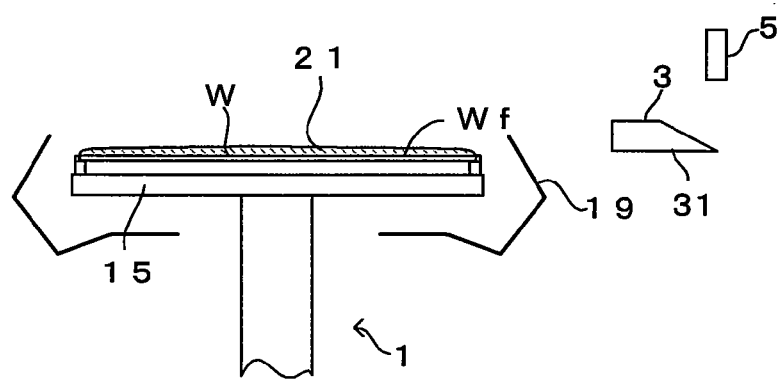

Upon rinsing for a predetermined period of time, the substrate W stops rotating and the rinse nozzle 8 moves to the retract position (the position denoted at the solid line in FIG. 1). The rinsing liquid adheres in a piled up state to the entire front surface Wf of the substrate thus rinsed, thereby forming the so-called puddle-like rinse layer 21 (FIG. 5B). Meanwhile, the rinse nozzle 8 may discharge the rinsing liquid again after rinsing to thereby form the rinse layer 21 which is shaped like a puddle on the entire front surface Wf of the substrate.

Figure 5C:
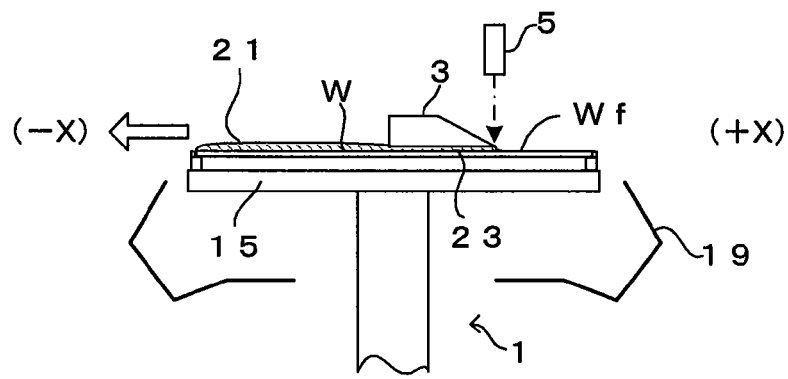

The control unit 4 then moves down the splashing preventing cup 19 to the lower position (the position denoted at the dotted line in FIG. 1), thereby making the spin base 15 projecting above the splashing preventing cup 19, and then, performs drying of the front surface Wf of the substrate. That is, as shown in FIG. 5C, the block driving mechanism 41 is operated to move the proximity block 3 at a constant velocity in the moving direction (−X), and the solvent gas supplying unit 43 is operated to discharge the solvent gas from the solvent gas nozzle 5.

The gap space SP between the opposed surface 31 and the front surface Wf of the substrate is filled up with the rinsing liquid (the liquid) to form the liquid-tight layer 23. When the proximity block 3 moves in the moving direction (−X) from the state shown in FIG. 6A to the state shown in FIG. 6B for instance, the upstream-side edge 231 of the liquid-tight layer 23 in the moving direction goes off from the proximity block 3 and gets exposed. At this stage, the solvent gas supplied toward the upstream-side edge 231 of the liquid-tight layer is dissolved in the liquid which forms the liquid-tight layer 23 to reduce the surface tension at the upstream-side interface (gas-liquid-solid interface) 231a of the liquid-tight layer 23, which causes Marangoni convection. In this way, the liquid which forms the liquid-tight layer 23 is pulled toward the downstream side (−X) in the moving direction, the upstream-side interface 231a as well moves toward the downstream side, and the substrate surface region corresponding to thus moving interface is dried.

While the dried region spreads toward the downstream side (−X) in the moving direction with the movement of the upstream-side interface 231a as described above, on the downstream side in the moving direction relative to the upstream-side interface 231a, the rinsing liquid (the liquid) remains in contact with the front surface Wf of the substrate to form the puddle-like rinse layer 21 until the entire front surface Wf of the substrate has dried up. Therefore, there is no occurrence that the rinsing liquid (liquid) is dried from the front surface Wf of the substrate through natural seasoning.

The proximity block 3 and the solvent gas nozzle 5 are moved in the moving direction (−X) in this way, whereby the substrate surface region which is dried, namely, the dried region spreads. Hence, it is possible to dry the entire front surface Wf of the substrate by scanning the proximity block 3 and the solvent gas nozzle 5 all over the substrate surface.

Figure 5D:
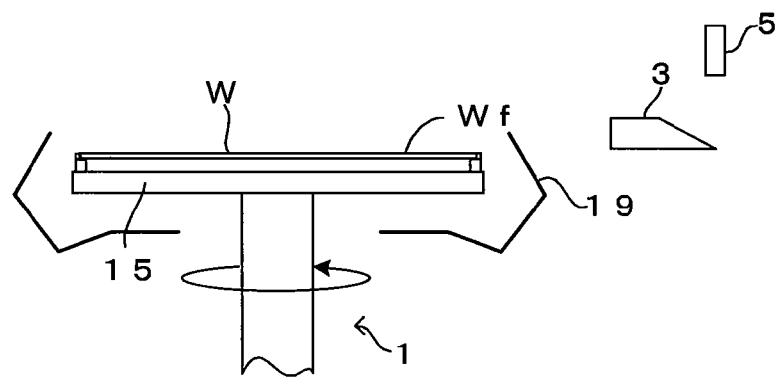

When the drying of the front surface Wf of the substrate completes in this way, drying of the back surface Wb is executed to remove the liquid component adhering to the back surface Wb of the substrate off from the substrate W. That is, as shown in FIG. 5D, the control unit 4 moves the splashing preventing cup 19 to the upper position, makes the chuck rotation driving mechanism 13 drive to rotate the substrate W, whereby the back surface Wb is drained off of the liquid component adhering thereto (i.e., execution of spin drying). Following this, the control unit 4 moves the splashing preventing cup 19 to the lower position, thereby making the spin base 15 projecting above the splashing preventing cup 19. In this state, the substrate transporter unloads thus processed substrate W out from the apparatus, which completes a series of cleaning of one substrate W.

As described above, according to this embodiment, the proximity block 3 is moved in the moving direction with the proximity block 3 positioned in the vicinity of the front surface Wf of the substrate to form the liquid-tight layer 23, and the solvent gas containing the solvent component, which is dissolved in the liquid forming the liquid-tight layer 23 to reduce the surface tension, is supplied toward the upstream-side edge 231 of the liquid-tight layer 23. In this way, Marangoni convection is caused at the upstream-side edge 231 and the upstream-side interface 231a is accordingly moved toward the downstream side while controlling the location of the upstream-side interface (gas-liquid-solid interface) 231a, whereby the substrate surface region is dried. It is thus possible to dry the substrate surface region utilizing the Marangoni effect while the proximity block 3 prevents the upstream-side interface 231a from getting disturbed, and hence, to prevent generation of drying defects such as water marks in this substrate surface region.

Further, the puddle-like rinse layer 21 is formed on the entire front surface Wf of the substrate when the rinsing is finished. Hence, it is possible to prevent from drying water droplets of the rinsing liquid remaining in patches on the front surface Wf of the substrate through natural seasoning. Therefore, generation of a water mark is prevented without fail and the front surface Wf of the substrate is dried in a favorable fashion.

Further, even when fine patterns FP are formed in the substrate surface region as shown in FIG. 6, since the front surface Wf of the substrate is dried utilizing the Marangoni effect while controlling the location of the upstream-side interface (gas-liquid-solid interface) 231a, the upstream-side interface 231a will not move back and forth in the moving direction and the liquid forming the liquid-tight layer 23 will therefore not impose any load upon the fine patterns FP, thereby making it possible to dry the front surface Wf of the substrate while effectively preventing destruction of the patterns. In addition, since the front surface Wf of the substrate is dried without rotating the substrate W, the centrifugal force attributed to the rotation of the substrate W will not destroy the patterns. Moreover, the solvent component is dissolved even in the liquid which is present in the gaps between the fine patterns FP and the surface tension of this liquid is accordingly lowered, thereby decreasing the negative pressure developing in the gaps between the patterns and effectively preventing destruction of the patterns.

<Second Embodiment>

Figure 7A:
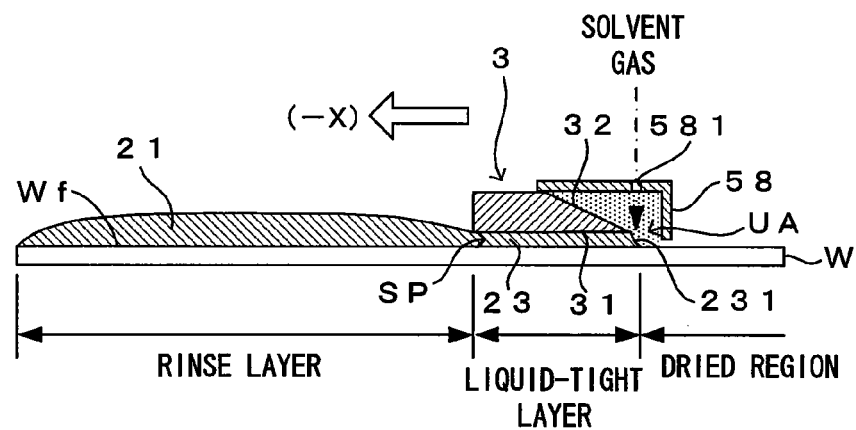
FIG. 7A is a partial side view of a substrate processing apparatus according to a second embodiment of the invention.
Figure 7B:
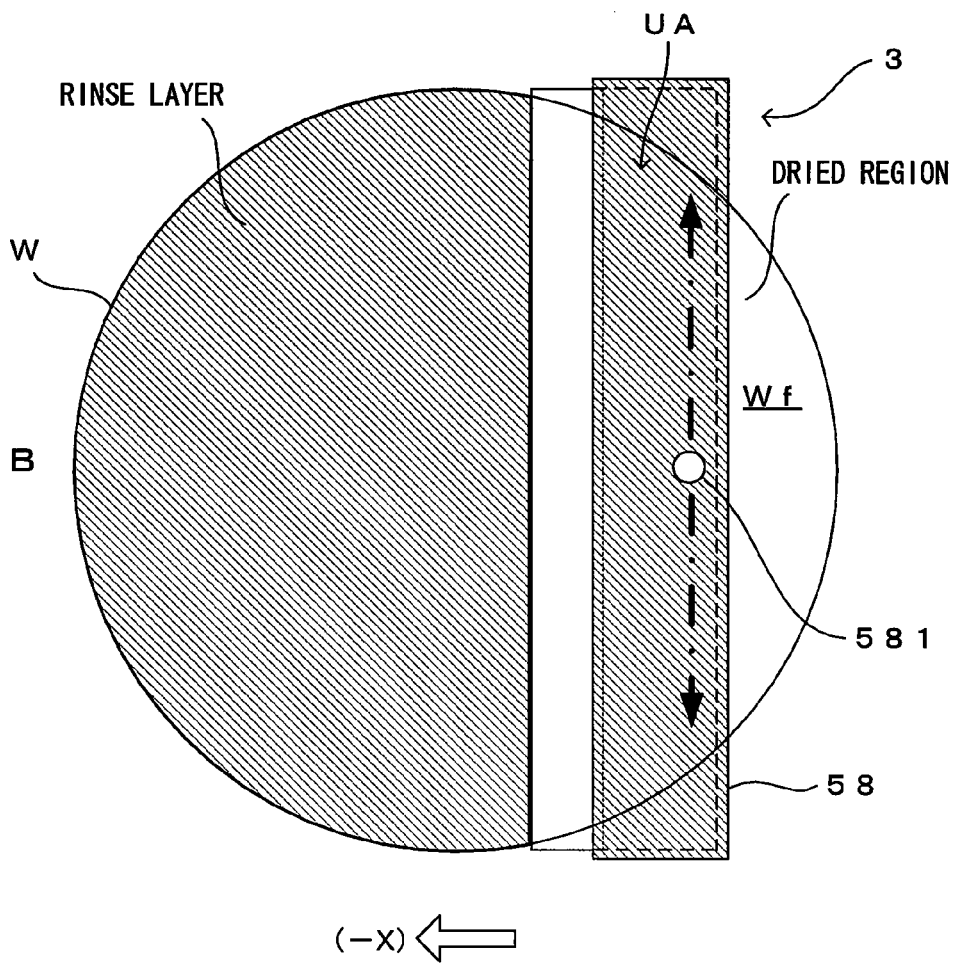
FIG. 7B is a plan view of the substrate processing apparatus shown in FIG. 7A.

FIGS. 7A and 7B are diagrams showing a substrate processing apparatus according to a second embodiment of the invention. To be more precise, FIG. 7A is a partial side view of the substrate processing apparatus and FIG. 7B is a plan view of the substrate processing apparatus shown in FIG. 7A. A major difference of the substrate processing apparatus according to the second embodiment from the first embodiment is that a cover member 58 is attached to the proximity block 3. The structures and the operations are otherwise basically similar to those according to the first embodiment, and therefore, they will be denoted at the same reference symbols but will not described in redundancy.

In this embodiment, at the upstream side (+X) of the proximity block 3 in the moving direction, the cover member 58 is attached to the proximity block 3 such that the cover member 58 entirely covers the upstream-side edge 231 of the liquid-tight layer 23. Therefore, an upstream-side atmosphere UA located at the upstream side (+X) relative to the liquid-tight layer 23 is surrounded by the cover member 58. The top surface of the cover member 58 has a gas supply hole 581, and via the gas supply hole 581, the solvent gas supplying unit 43 is communicated with the upstream-side atmosphere UA which is surrounded by the cover member 58. Meanwhile, the top surface of the cover member 58 may have a plurality of gas supply holes in the width direction. And the solvent gas supplying unit 43 is operated in response to an operation command received from the control unit 4, and accordingly, the solvent gas is supplied to the upstream-side atmosphere UA from the solvent gas supplying unit 43. Therefore, the cover member 58 traps the solvent gas, whereby the concentration of the solvent gas in the upstream-side atmosphere UA remains high. As a result, it is possible to facilitate reduction of the surface tension at the upstream-side edge 231 of the liquid-tight layer 23 and to enhance the effect of preventing pattern destruction. Further, the cover member 58 has the same length taken in the moving direction all across the width direction. It is therefore possible to ensure a space whose length taken in the moving direction is uniform in the width direction (longitudinal direction) inside the cover member 58 and to keep the concentration of the solvent gas uniform in the width direction. Hence, it is possible to dry the front surface Wf of the substrate uniformly in the width direction.

<Third Embodiment>

Figure 8:
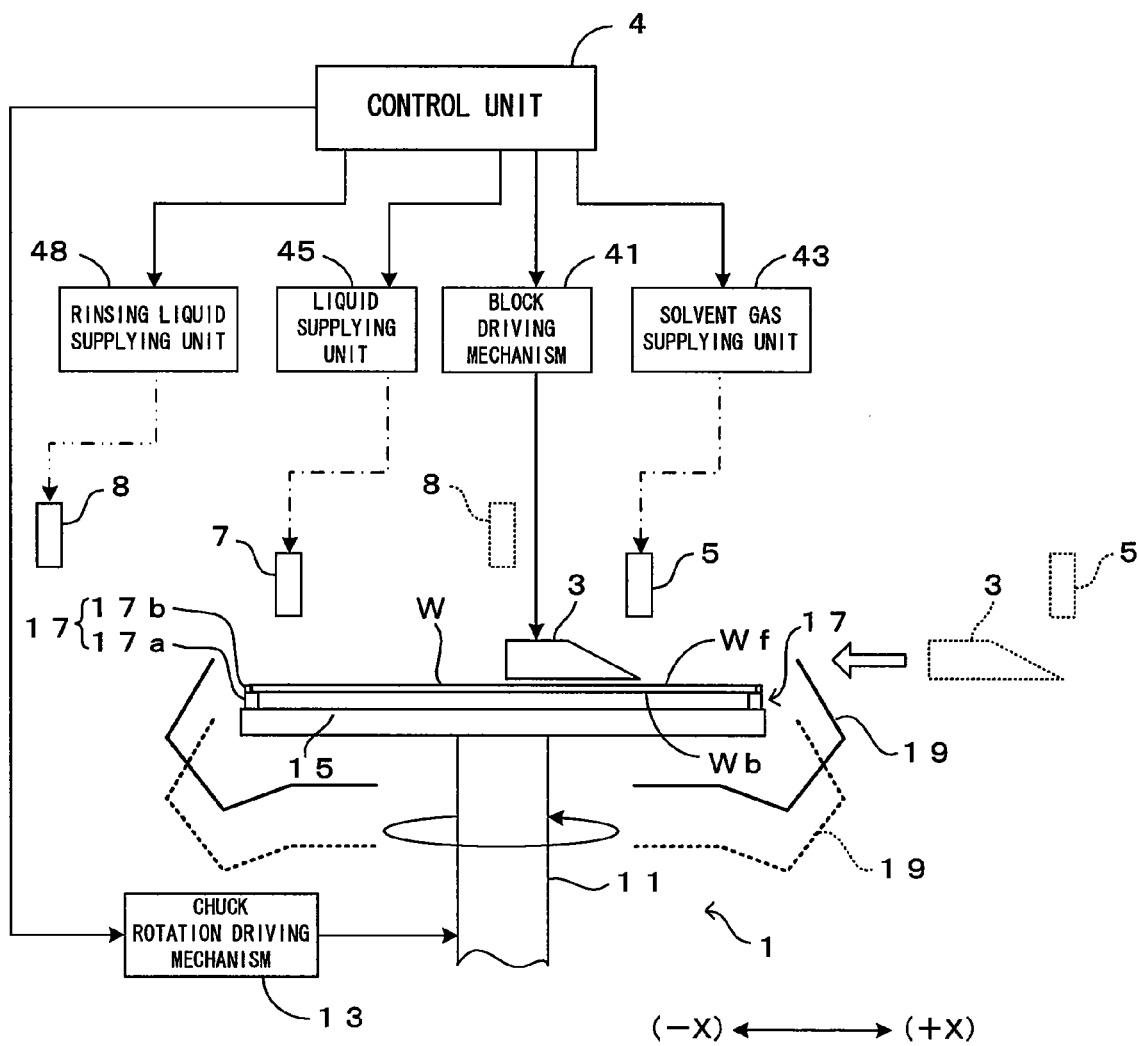
FIG. 8 is a diagram showing a substrate processing apparatus according to a third embodiment of the invention.
Figure 9A:
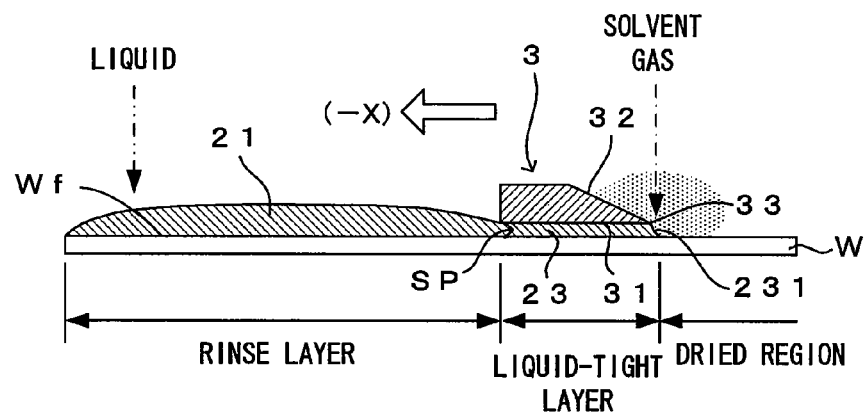
FIG. 9A is a partial side view of the substrate processing apparatus shown in FIG. 8.
Figure 9B:
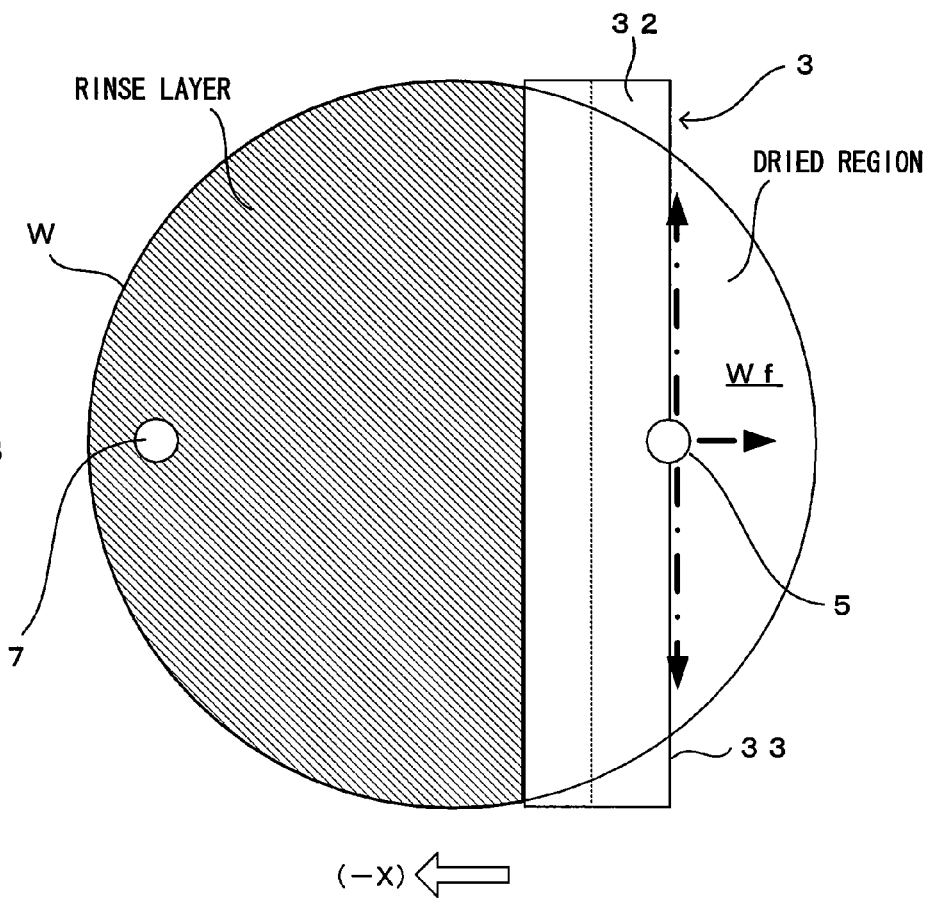
FIG. 9B is a plan view of the substrate processing apparatus shown in FIG. 9A.

FIG. 8 is a diagram showing a substrate processing apparatus according to a third embodiment of the invention. FIGS. 9A and 9B are partially enlarged views of the substrate processing apparatus shown in FIG. 8. To be more precise, FIG. 9A is a partial side view of the substrate processing apparatus and FIG. 9B is a plan view of the substrate processing apparatus shown in FIG. 9A. A major difference of the substrate processing apparatus according to the third embodiment from the first embodiment is that the liquid is supplied additionally to the rinse layer 21 on the front surface Wf of in the substrate in the downstream side relative to the proximity block 3 in the moving direction while e the proximity block 3 is moving relatively. The structures and the operations are otherwise basically similar to those according to the first embodiment, and therefore, they will be denoted at the same reference symbols but will not described in redundancy.

In this third embodiment, a liquid nozzle 7 for liquid supply is disposed at the upper position above the proximity block 3 and at the downstream side relative to the proximity block 3 in the moving direction. Meanwhile, a plurality of liquid nozzles may be disposed instead. A liquid supplying unit 45 is connected to the liquid nozzle 7. The liquid supplying unit 45 is activated in accordance with an operation command from the control unit 4 and pressure-feeds the liquid containing the same component as that of the rinsing liquid adhering to the substrate W into the liquid nozzle 7. In this way, the liquid is supplied to the rinse layer 21 in contact with the front surface Wf of the substrate from the liquid nozzle 7. Hence, the state that the puddle-like rinse layer 21 is formed on the front surface Wf of the substrate in the downstream side in the moving direction relative to the upstream-side edge 231 of the liquid-tight layer 23 is surely maintained. Thus, in this embodiment, the liquid nozzle 7 and the liquid supplying unit 45 function as a "second liquid supplier" of the invention.

As described above, according to this embodiment, the liquid nozzle 7 supplies the liquid to the rinse layer 21 until the entire front surface Wf of the substrate has dried up, to thereby maintain the state that the puddle-like rinse layer 21 is formed on the front surface e Wf of the substrate at the downstream side (−X) in the moving direction relative to the upstream-side edge 231 of the liquid-tight layer 23. Therefore, it is surely possible to prevent an occurrence of an area in the front surface Wf of the substrate from which the rinsing liquid is dried through natural seasoning, and hence, it is possible to dry the entire front surface Wf of the substrate only by the Marangoni effect. As a result, generation of a water mark is prevented without fail and the front surface Wf of the substrate is dried in a favorable fashion.

<Fourth Embodiment>

Figure 10:
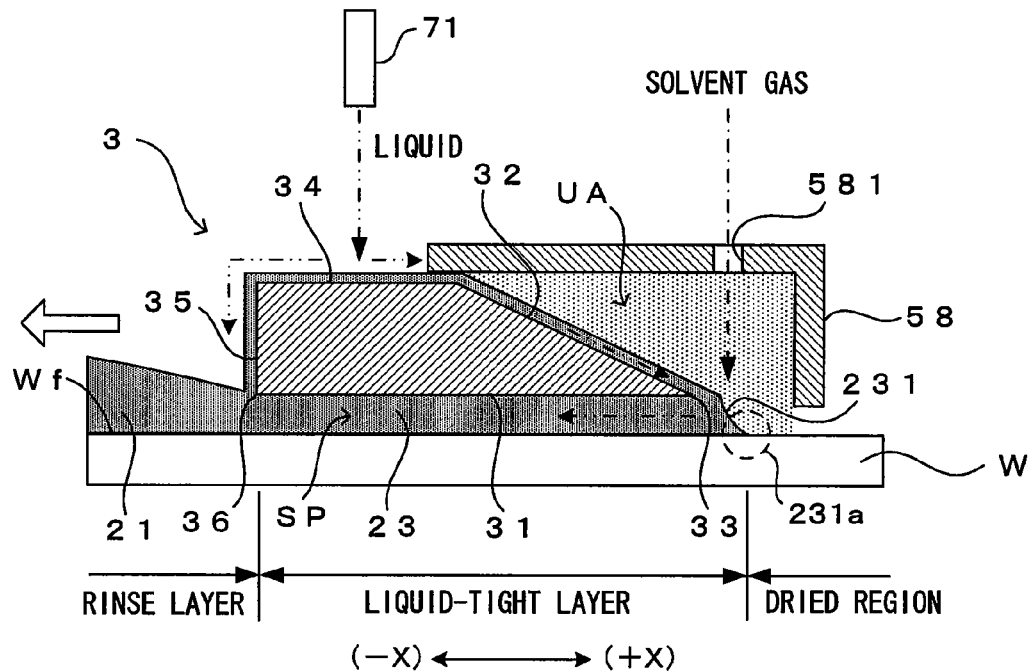
FIG. 10 is a diagram showing a substrate processing apparatus according to a fourth embodiment of the invention.

FIG. 10 is a diagram showing a substrate processing apparatus according to a fourth embodiment of the invention. A major difference of the substrate processing apparatus according to the fourth embodiment from the second embodiment is that the liquid is additionally supplied to a top surface 34 of the proximity block 3. That is, this fourth embodiment differs in that a cover member 58 is attached to the proximity block 3 in the structure of the third embodiment and that the liquid is supplied to the top surface 34 of the proximity block 3 instead of supplying the liquid directly to the rinse layer 21 which is in contact with the front surface Wf of the substrate.

The structures and the operations are otherwise basically similar to those according to the second and third embodiments, and therefore, they will be denoted at the same reference symbols but will not described in redundancy.

In this embodiment, a liquid nozzle 71 for liquid supply is disposed at the upper position above the proximity block 3. Meanwhile, a plurality of liquid nozzles arranged in the width direction may be disposed instead. The liquid supplying unit 45 is connected to the liquid nozzle 71. With the moving of the proximity block 3, the liquid supplying unit 45 pressure-feeds the liquid containing the same component as that of the rinsing liquid adhering to the substrate W into the liquid nozzle 71 and the liquid nozzle 71 discharges the liquid toward the top surface 34 of the proximity block 3. Due to this, with the movement of the upstream-side interface 231a of the liquid-tight layer 23, the liquid is supplied to the top surface 34 of the proximity block 3. Thus, in this embodiment, the liquid nozzle 71 functions as a "second nozzle" of the invention, and the liquid nozzle 71 and the liquid supplying unit 45 function as a "second liquid supplier" of the invention.

The liquid supplied to the top surface 34 of the proximity block 3 flows down toward the upstream side 33 along the side surface (extending surface) 32 from the top surface 34, while flowing down toward a downstream side 36 which is one of sides defining the opposed surface 31 and which is located on the downstream side (−X) in the moving direction along a side surface 35 overlooking the downstream side of the proximity block 3 from the top surface 34. In this way, the liquid flowing down toward the upstream side 33 is supplied to the upstream-side interface 231a of the liquid-tight layer 23, while the liquid flowing down toward the downstream side 36 is supplied to a boundary portion between the rinse layer 21 and the liquid-tight layer 23. In consequence, the liquid is additionally supplied to the rinse layer 21 which is in contact with the front surface Wf of the to the subsrate at the upstream-side interface 231a or on the downstream side (−X) in the moving direction relative to the upstream-side interface 231a. Therefore, as in the third embodiment, it is surely possible to prevent an occurrence of an area in the front surface Wf of the substrate which is dried through natural seasoning, and hence, it is possible to dry the front surface Wf favorably. Thus, in this embodiment, the side surfaces 32, 34 and 35 function as a "non-opposed surface" of the invention.

Further, according to this embodiment, while the liquid discharged from the liquid nozzle 71 flows down toward the upstream side 33 along the side surface 32, it is possible to dissolve the solvent gas in this liquid. This efficiently sends the liquid whose surface tension has decreased toward the rinsing liquid (the liquid) contacting the front surface Wf of the substrate at the upstream-side interface 231a of the liquid-tight layer 23. It is therefore possible to effectively lower the surface tension at the upstream-side interface 231a, efficiently cause Marangoni convection, and enhance the efficiency of drying the front surface Wf of the substrate. Furthermore, according to this embodiment, the opposed surface 31 and the side surface (extending surface) 32 are structured to be at an acute angle. Therefore, it becomes possible for the liquid to flow down gradually to the upstream-side interface 231a of the liquid-tight layer 23 via the side surface (extending surface) 32, and hence, it is possible for the solvent gas to get securely dissolved in the liquid while the liquid flows down the side surface 32. As a result the efficency of drying the front surface Wf of the substrate can be further improved.

Further, according to this embodiment, the following excellent effect is attained. That is, since the liquid is supplied toward the front surface Wf of the substrate via the proximity block 3, to be more specific, since the liquid is supplied toward the front surface Wf of the substrate along the side surfaces 32, 34 and 35 of the proximity block 3, the liquid discharged from the liquid nozzle 71 is guided to the front surface Wf of the substrate while the flow thereof is aligned by the proximity block 3. Therefore, it is possible to supply the liquid to the front surface Wf of the substrate in a uniform flow as compared with the case where the liquid is supplied directly to the front surface Wf of the substrate. And hence, it is possible to suppress generation of residual water droplets on the front surface Wf of the substrate due to splashing of the liquid or the like.

Further, for prevention of drying defects on the front surface Wf of the substrate, it is desirable that the drying speed, namely, a velocity at which the upstream-side interface 231a of the liquid-tight layer 23 moves is constant. This embodiment is very effective in ensuring that the drying speed remains constant. That is, according to this embodiment, since the liquid is supplied to the upstream-side interface 231a of the liquid-tight layer 23, it is possible to suppress a change of the solvent component concentration in the solution (the liquid+the solvent component) which is the liquid in which the solvent component has been dissolved at the upstream-side interface 231a. In this way, it is possible to make the degree of the decrease of the surface tension approximately constant at the upstream-side interface 231a and to maintain a velocity at which the upstream-side interface (gas-liquid-solid interface) 231a moves due to Marangoni convection constant. Thus, the moving velocity of the upstream-side interface 231a is made constant, and accordingly, it is possible to uniformly dry the front surface Wf of the substrate while preventing water droplets from remaining on the front surface Wf of the substrate.

Further, since supply of the liquid to the upstream-side interface 231a of the liquid-tight layer 23 means supply of the liquid to a region adjacent to the dried region, the amount of the liquid supplied to the upstream-side interface 231a must be very small. In this regard, according to this embodiment, it is so structured that a part of the liquid discharged from the liquid nozzle 71 is guided toward the upstream side 33, whereas the remainder thereof is guided toward the downstream side 36. Hence, it is possible to improve the controllability of the flow rate of the liquid discharged from the liquid nozzle 71.

<Fifth Embodiment>

Figure 11:
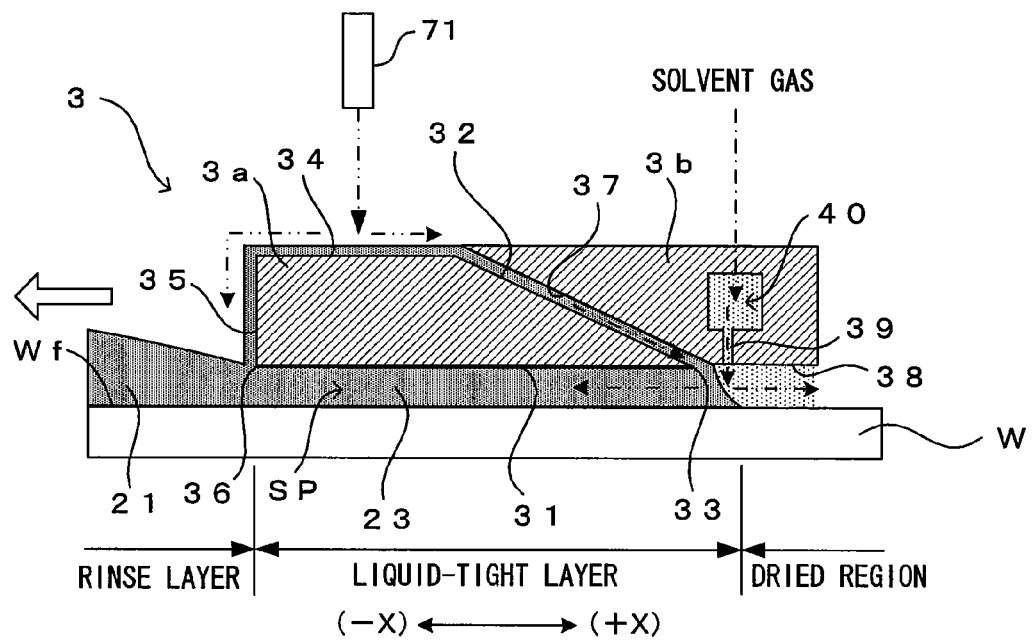
FIG. 11 is a diagram showing a substrate processing apparatus according to a fifth embodiment of the invention.

FIG. 11 is a diagram showing a substrate processing apparatus according to a fifth embodiment of the invention. A major difference of the substrate processing apparatus according to the fifth embodiment from the fourth embodiment is addition of a structure for guiding the liquid discharged from the liquid nozzle 71 to the upstream side 33 while maintaining the liquid discharged from the liquid nozzle 71 liquid-tight on the side surface 32 and addition of a structure for preventing the solvent gas from staying stagnant. The structures and the operations are otherwise basically similar to those according to the fourth embodiment, and therefore, they will be denoted at the same reference symbols but will not described in redundancy.

In this embodiment, the proximity block 3 comprises a main section 3a and an opposed section 3b. The main section 3a is utilized in the embodiments described above and forms the liquid-tight layer 23 in the gap space SP formed between the opposed surface 31 and the front surface Wf of the substrate. The opposed section 3b is disposed facing the main section 3a on the upstream side (+X) in the moving direction relative to the main section 3a. The opposed section 3b, like the main section 3a, is in a shape of a right prism of which the vertical cross section is approximately a trapezoid. One side surface of the opposed section 3b is a guide surface 37 which faces the side surface (extending surface) 32 of the main section 3a and guides the liquid discharged from the liquid nozzle 71 to the upstream side 33. The liquid discharged from the liquid nozzle 71 then flows down from the top surface 34 toward the upstream side 33 while filling up the clearance between the side surface (extending surface) 32 and the guide surface 37 in a liquid-tight state. Therefore, it is possible for the liquid to flow down to the upstream-side interface 231a of the liquid-tight layer 23 while being trapped between the side surface 32 and the guide surface 37. Hence, it is possible to ensure that the liquid flows uniformly even though the amount of the liquid guided to the upstream side 33 is very small. Thus, it is possible to supply a constant amount of the liquid to the upstream-side interface 231a and to control a velocity at which the upstream-side interface (gas-liquid-solid interface) 231a moves due to Marangoni convection to a constant velocity. Therefore, it is very effective in uniformly drying the front surface Wf of the substrate. Further, as in the embodiments described above, it is possible to maintain the state that the puddle-like layer 21 is formed by the additional supply of the liquid, to prevent the front surface Wf of the substrate from drying through natural seasoning more surely, and to favorably dry the front surface Wf of the substrate.

Further, a bottom surface (corresponding to an "upstream-side opposed section" of the invention) 38 of the opposed section 3b is an opposed surface which faces the front surface Wf of the substrate, and which includes a gas discharge outlet 39. A manifold 40 which is communicated with the solvent gas supplying unit 43 is disposed inside the opposed section 3b. When the solvent gas supplying unit 43 operates in response to an operation command received from the control unit 4, the solvent gas is supplied to the manifold 40 from the solvent gas supplying unit 43. The solvent gas is thereafter discharged toward the upstream-side edge 231 of the liquid-tight layer 23 through the gas discharge outlet 39 from the manifold 40. Hence, the solvent gas discharged from the gas discharge outlet 39, after contacting the upstream-side edge 231 of the liquid-tight layer 23, gets discharged to the upstream side (+X) in the moving direction or to the side relative to the moving direction, i.e., in the width direction, via the space which is between the bottom surface 38 of the opposed section 3b and the front surface Wf of the substrate. Thus, it is possible for the solvent gas to flow evenly to prevent the solvent gas from staying stagnant. It is therefore possible to suppress generation of particles, uniformly supply the solvent gas to the upstream-side interface 231a and uniformly dry the front surface Wf of the substrate.

<Sixth Embodiment>

Figure 12:
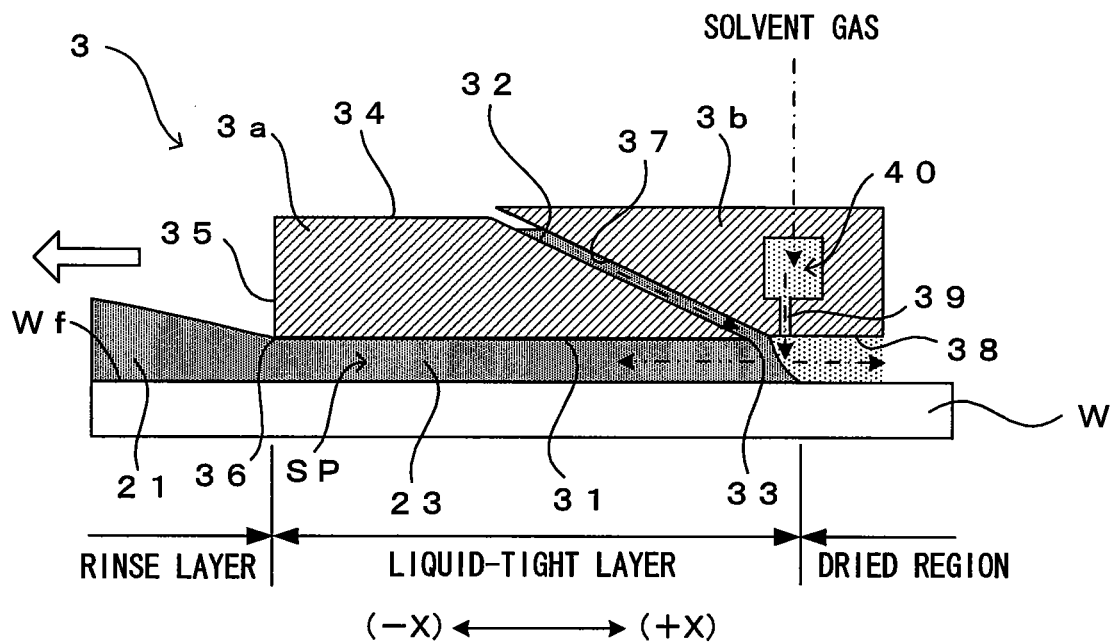
FIG. 12 is a diagram showing a substrate processing apparatus according to a sixth embodiment of the invention.

FIG. 12 is a diagram showing a substrate processing apparatus according to a sixth embodiment of the invention. A major difference of the substrate processing apparatus according to the sixth embodiment from the fifth embodiment is that the liquid is supplied to the proximity block 3 before scanning the proximity block 3 on the front surface Wf of the substrate instead of supplying the liquid to the proximity block 3 from the liquid nozzle 71 while moving the proximity block 3. The structures and the operations are otherwise basically similar to those according to the fifth embodiment.

In this embodiment, the liquid is supplied between the side surface (extending surface) 32 and the guide surface 37 immediately before the proximity block 3 comes to its initial position in the moving direction, i.e., disposed opposed against the front surface Wf of the substrate and scans the front surface Wf of the substrate. And when the proximity block 3 scans the front surface Wf of the substrate, that is, when the proximity block 3 moves in the moving direction from its initial position above, the liquid flows down gradually toward the upstream side 33 from the clearance between the side surface (extending surface) 32 and the guide surface 37 and is accordingly supplied to the upstream-side interface 231a. Since the amount of the liquid supplied to the upstream-side interface 231a which is adjacent to the dried region is very small, the liquid held in this fashion between the side surface 32 and the guide surface 37 sufficiently dries the entire front surface Wf of the substrate. In addition, it is desirable that the angle between the opposed surface 31 and the side surface 32 is optimized so as to supply an appropriate amount of the liquid continuously to the upstream-side interface 231a during drying of the entire surface of one substrate.

According to this embodiment, since it is possible to make the liquid flow down to the upstream-side interface 231a of the liquid-tight layer 23 while trapping the liquid between the side surface 32 and the guide surface 37 as in the fifth embodiment, it is possible to ensure that the liquid flows uniformly even though the amount of the liquid guided toward the upstream side 33 is very small. Hence, it is possible to maintain the amount of the liquid supplied to the upstream-side interface 231a constant and evenly dry the front surface Wf of the substrate. In addition, it is possible to simplify the structure of the apparatus since the liquid nozzle 71 needs not move in synchronization to the proximity block 3. Further, as in the embodiments described above, it is possible to maintain the state that the puddle-like layer 21 is formed by the additional supply of the liquid, to prevent the front surface Wf of the substrate from drying through natural seasoning more surely, and to favorably dry the front surface Wf of the substrate.

<Seventh Embodiment>

Figure 13:
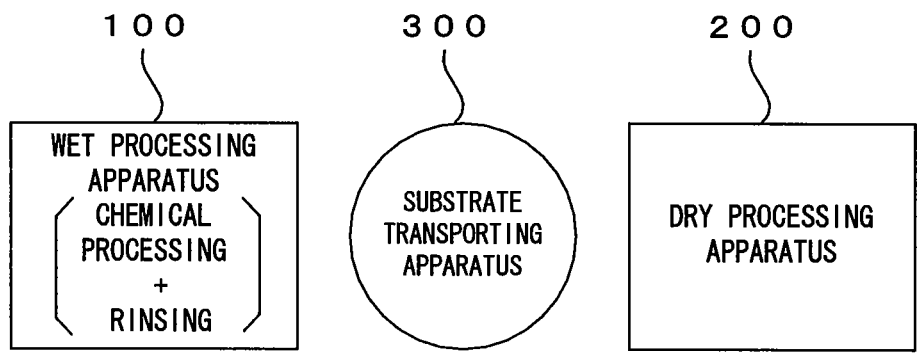
FIG. 13 is a diagram showing a substrate processing system which includes a dry processing apparatus which is a substrate processing apparatus according to a seventh embodiment of the invention.
Figure 14:
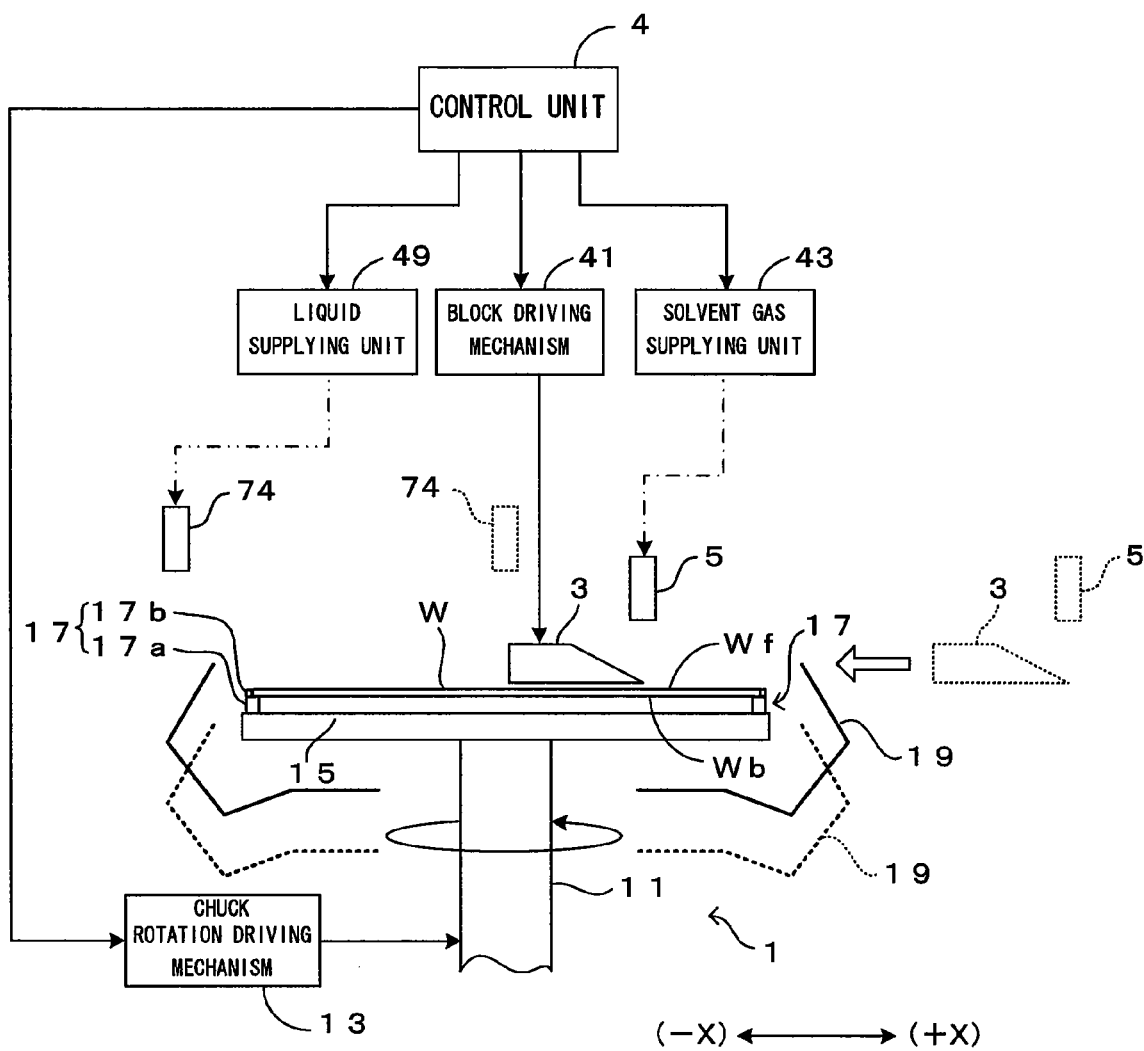
FIG. 14 is a diagram showing the dry processing apparatus shown in FIG. 13.

FIG. 13 is a diagram showing a substrate processing system which includes a dry processing apparatus which is a substrate processing apparatus according to a seventh embodiment of the invention. FIG. 14 is a diagram showing the dry processing apparatus shown in FIG. 13. In the embodiments described above, after wet processing such as chemical processing and rinsing are executed to the substrate W which is held by the spin chuck 1, drying is executed to the rinsed substrate within the same apparatus with the proximity block 3 scanning in the moving direction. However, the wet processing and the drying are performed separately from each other in this embodiment. That is, in the substrate processing system shown in FIG. 13, a wet processing apparatus 100 which performs chemical processing and rinsing of the substrate W is disposed over a certain distance from a dry processing apparatus 200 in which the proximity block 3 is incorporated and dries the substrate W. And a substrate transporting apparatus 300 transports the substrate finally rinsed by the wet processing apparatus 100 to the dry processing apparatus 200 for execution of drying. Meanwhile, the same structures as in the first embodiment will be denoted at the same reference symbols and will not be described.

In the dry processing apparatus 200 in this embodiment, a liquid nozzle 74 is disposed which is movable between an upper position (the position denoted at dashed line in FIG. 14) which is above the approximate center of the substrate W and a retract position (the position denoted at solid line in FIG. 14) which is off the substrate W. A liquid supplying unit 49 is connected to this liquid nozzle 74. The liquid supplying unit 49 is activated based upon the operation command from the control unit 4 and pressure-feeds the liquid to the liquid nozzle 74. In this way, the liquid is supplied to the front surface Wf of the substrate from the liquid nozzle 74. Purified water or DIW is used as the liquid for example. Meanwhile, the liquid may not be the same as the rinsing liquid used in the wet processing apparatus 100 in this embodiment. Thus, in this embodiment, the liquid nozzle 74 corresponds to a "first nozzle" of the invention, and the liquid nozzle 74 and the liquid supplying unit 49 function as a "liquid layer forming section" and a "first liquid supplier" of the invention.

Then, the liquid nozzle 74 is positioned at the upper position (the position denoted at dashed line in FIG. 14) which is above the approximate center of the substrate W, after the substrate transporting apparatus 300 has transported the substrate W to the dry processing apparatus 200 and before the opposed surface 31 of the proximity block 3 is faced against the front surface Wf of the substrate to form the liquid-tight layer 23, the liquid supplying unit 49 is activated to supply the liquid from the liquid nozzle 74 to the front surface Wf of the substrate, and the substrate W is rotated, to thereby form a puddle-like liquid layer on the entire front surface Wf of the substrate. According to this embodiment, the puddle-like liquid layer is formed on the entire front surface Wf of the substrate with the liquid supplied from the liquid nozzle 74 before the opposed surface 31 of the proximity block 3 is faced against the front surface Wf of the substrate to form the liquid-tight layer 23. Hence, it is possible to achieve the same effect as in the first embodiment described above.

<Others>

The invention is not limited to the embodiments described above but may be modified in various manners in addition to the embodiments above, to the extent not deviating from the object of the invention. For instance, although the proximity block 3 has a shape like a rod which is as wide as or wider than the substrate W in the embodiments described above, the outer shape of the proximity block 3 is not limited to this but may for instance be like a semi-ring which matches with the outer peripheral shape of the substrate W. Further, in the embodiments described above, drying is executed while moving the proximity block 3 with the substrate W fixed. However, the substrate as well may move relative to the proximity block at the same time. Alternatively, the proximity block 3 may be fixed and the substrate W alone may be moved. The requirement in this regard is that the proximity block 3 moves in the moving direction relative to the substrate W in a state that the gap space SP between the opposed surface 31, which is spaced apart from the front surface Wf of the substrate, and the front surface Wf of the substrate is filled up with the rinsing liquid and the liquid-tight layer 23 is accordingly formed.

Figure 15:
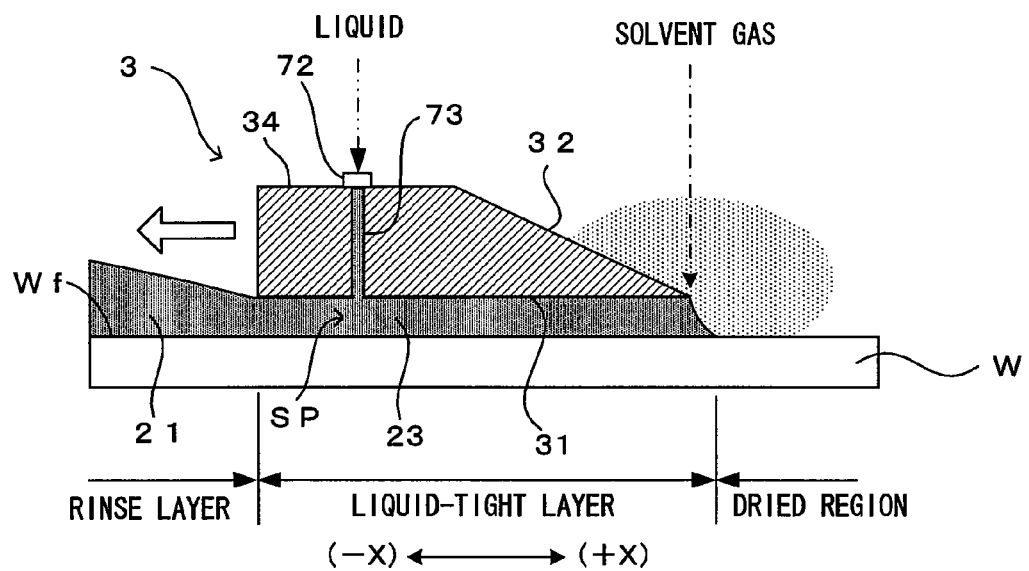
FIG. 15 is a side view of a substrate processing apparatus according to other embodiment of the invention.

Further, in the third embodiment described above, the liquid is supplied from the liquid nozzle 7 to the front surface Wf of the substrate on the downstream side (−X) in the moving direction relative to the proximity block 3, but the method of supplying the liquid is not limited to this. As shown in FIG. 15 for instance, one liquid supplying port 72 or plural liquid supplying ports 72 may be disposed at the top surface 34 of the proximity block 3 to supply the liquid to the liquid-tight layer 23 via the inside of the proximity block 3. The liquid supplying port 72 is connected with a supply path 73 which is disposed inside the proximity block 3. Further, the liquid supplying port 72 is communicated with the liquid supplying unit 45. And the liquid supplying unit 45 is operated in accordance with an operation command from the control unit 4, and accordingly, the liquid supplying unit 45 supplies the liquid to the gap space SP between the proximity block 3 and the front surface Wf of the substrate via the liquid supplying port 72 and the supply path 73. Therefore, since the liquid is additionally supplied to the liquid-tight layer 23, the state that the puddle-like rinse layer 21 is formed on the front surface Wf of the substrate is maintained. In consequence, as in the embodiments described above, it is possible to prevent an occurrence of an area which is dried through natural seasoning in the front surface Wf of the substrate, and to prevent generation of a water mark.

Further, in the third embodiment described above, although the liquid is supplied from the liquid nozzle 7 to the front surface Wf of the substrate on the downstream side (−X) in the moving direction relative to the proximity block 3, the method of supplying the liquid is not limited to this. It may be structured to be able to position the rinse nozzle 8 at the position of the liquid nozzle 7 instead of the liquid nozzle 7 for instance, and the liquid may be supplied from the rinse nozzle 8 to the front surface Wf of the substrate on the downstream side (−X) in the moving direction relative to the proximity block 3. According to this modification, it is possible to simplify the structure since the liquid nozzle 7 and the liquid supplying unit 45 are made unnecessary. Meanwhile, in these cases, that is, in the third embodiment and in the above-mentioned modification, it may be structured to be able to move the liquid nozzle 7 or the rinse nozzle 8 with the proximity block 3, and the liquid may be supplied to the front surface Wf of the substrate on the downstream side (−X) in the moving direction relative to the proximity block 3 while moving the liquid nozzle 7 or the rinse nozzle 8 with the proximity block 3.

Further, in the seventh embodiment described above, although the liquid is supplied from the liquid nozzle 74 to form a puddle-like liquid layer on the entire front surface Wf of the substrate, after the substrate transporting apparatus 300 has transported the substrate W to the dry processing apparatus 200 and before the proximity block 3 is moved, the invention is not limited to this. For example, the substrate transporting apparatus 300 may transport the substrate to the dry processing apparatus 200 for execution of drying in the state that the puddle-like rinse layer is formed on the entire surface of the substrate which is rinsed in the wet processing apparatus 100. In this modification, the wet processing apparatus 100 corresponds to a "liquid layer forming section" and a "wet processor" of the invention. According to this modification, it is possible to simplify the structure compared to the above-described seventh embodiment, since the liquid nozzle 74 and the liquid supplying unit 45 are made unnecessary.

As for the shape of the proximity block 3, while the proximity block 3 is structured so that the side surface (extending surface) 32 is at the acute angle θ with respect to the opposed surface 31 in the embodiments described above, the shape of the proximity block 3 is not limited to this: for instance, the side surface 32 may be at a right angle with respect to the opposed surface 31. In the event that the side surface 32 is at a right angle with respect to the opposed surface 31, since the liquid can not stay on the side surface 32, it is necessary to supply the liquid from the liquid nozzle 7 or 71 or from the liquid supplying port 72 as described in the third through fifth embodiments or the embodiment shown in FIG. 14, when the drying is executed while supplying the liquid.

Figure 16:
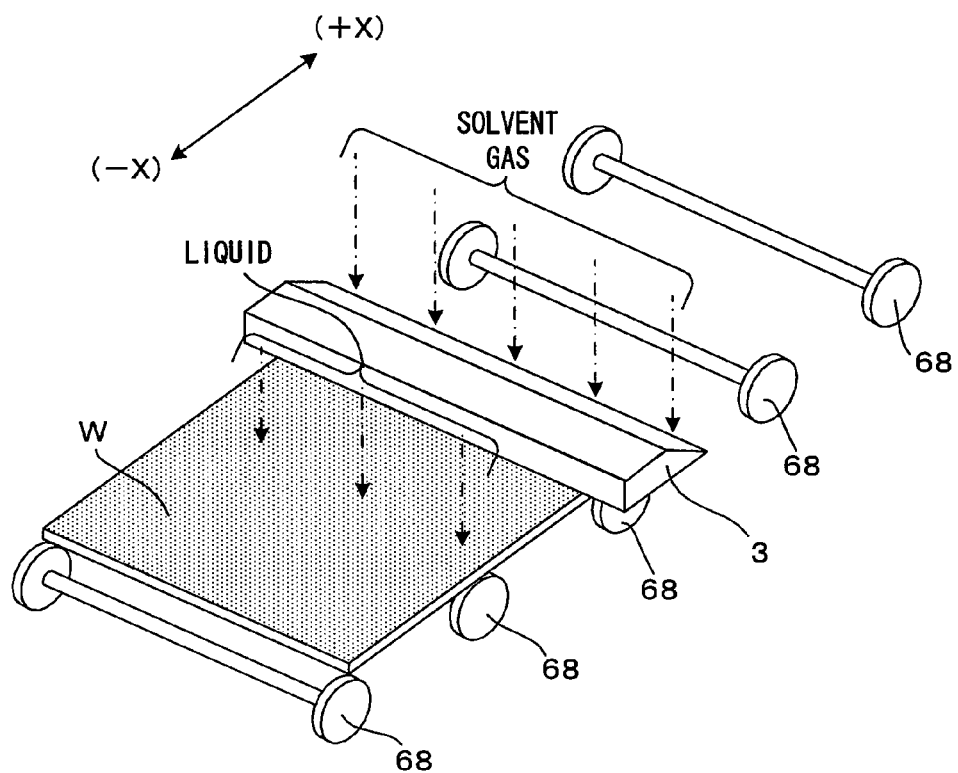
FIG. 16 is a perspective view of a substrate processing apparatus according to another embodiment of the invention.

Further, in the embodiments described above, although drying is executed to the substrate W which is approximately disk-shaped, an object to be processed with the substrate processing apparatus according to the invention is not limited to this. For instance, the invention is applicable also to a substrate processing apparatus which dries a surface of a rectangular substrate such as a glass substrate for liquid crystal display. As shown in FIG. 16 for instance, plural transportation rollers 68 corresponding to a "driver" of the invention may be disposed in the transportation direction (+X) and a proximity block 3 having the identical structure to that according to the embodiments described above may be fixed while the transportation rollers 68 transport the substrate W.

While the "predetermined moving direction" of the invention corresponds to the opposite direction (−X) to the transportation direction since the substrate W is transported in the transportation direction (+X) in such a substrate processing apparatus, basic operations are exactly the same as those in the embodiments described above and similar effects are obtained.

Further, in the embodiments described above, although the opposed surface 31 of the proximity block 3 is disposed away from the front surface Wf of the substrate and the liquid-tight layer 23 is formed in the gap space SP, after the puddle-like rinse layer 21 or the liquid layer is formed on the entire front surface Wf of the substrate, the invention is not limited to the embodiment to form the puddle-like rinse layer 21 or the liquid layer on the entire front surface Wf of the substrate. The point is to form the puddle-like rinse layer 21 or the liquid layer on the entire front surface Wf of the substrate in the downstream side (−X) in the moving direction relative to the upstream-side edge 231 of the liquid-tight layer 23. This allows the drying by the Marangoni effect from the wet state with the liquid, drying through natural seasoning is avoided, and it is possible to dry the front surface Wf of the substrate favorably only by the Marangoni effect.

Further, in the embodiments described above, although drying is executed by relatively moving the proximity block 3 in the moving direction relative to the substrate W whose front surface Wf to be dried is directed toward above, the posture of the substrate is not limited to this.

Further, in the embodiments above, although drying is performed to the substrate surface Wf which is wet with the rinsing liquid, the invention is applicable also to a substrate processing apparatus which dries the substrate surface which is wet with other liquid than the rinsing liquid.

The invention is applicable to a substrate processing apparatus which dries a surface of any general substrate which may be a semiconductor wafer, a glass substrate for photomask, a glass substrate for liquid crystal display, a glass substrate for plasma display, a substrate for an optical disk, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which dries a surface of a substrate which is wet with a liquid, the apparatus comprising:
   a proximity member made of quartz, which includes an opposed surface facing the surface of the substrate and which is structured to move freely and relatively in a predetermined moving direction relative to the substrate in a condition that the opposed surface is positioned away from the surface of the substrate and that a gap space between the opposed surface and the surface of the substrate is filled up with the liquid to form a liquid-tight layer;
   wherein the proximity member has the shape of a right prism and is substantially trapezoidal in its vertical cross-section, including an extending surface which is connected with an upstream side which is one of sides defining the opposed surface and which is located on the upstream side of the proximity member in the moving direction, and which extends inclined from the upstream side in a direction away from the substrate surface overlooking the upstream side in the moving direction; and wherein the proximity member forms an interface of the liquid-tight layer at the upstream side, contained between the upstream side and the surface of the substrate;

a driver which relatively moves the proximity member in the moving direction relative to the substrate;

a solvent gas supplier which supplies a solvent gas which is one of IPA, ethyl alcohol and methyl alcohol toward an upstream-side end portion of the liquid-tight layer in the moving direction, the solvent gas containing a solvent component which dissolves in the liquid to reduce a surface tension;

wherein the solvent gas supplier includes a gas nozzle which is disposed in a space above the upstream-side end portion of the proximity member, and which discharges the solvent gas from above so as to supply the solvent gas toward the upstream-side end portion of the proximity member, the solvent gas being guided at least partly along the extending surface of the proximity member; and a liquid layer forming section which forms a liquid puddle layer on an entire downstream-side surface of the substrate relative to the upstream-side end portion of the liquid-tight layer in the moving direction;

at the upstream-side end portion of the proximity member, the opposed surface and the extending surface are at an acute angle, so as to form a meniscus between the vicinity of the upstream side of the proximity member and the substrate, thereby maintaining a gas-liquid-solid interface on the surface of the substrate in the vicinity of the upstream side; and a liquid supplier which, while the proximity member relatively moves, supplies the liquid toward the downstream-side surface of the substrate relative to the upstream-side end portion of the liquid-tight layer in the moving direction, thereby maintaining the puddle-like liquid layer on the entire downstream-side surface of the substrate relative to the upstream-side end portion of the liquid-tight layer.

2. The substrate processing apparatus of claim 1, wherein the liquid layer forming section includes a wet processor which executes a predetermined wet processing to the surface of the substrate with the liquid and forms the liquid puddle layer on an entire surface of the substrate after the execution of the wet processing, and wherein the opposed surface of the proximity member is positioned away from the surface of the substrate and the liquid-tight layer is formed in the gap space, after the liquid puddle layer is formed on the entire surface of the substrate.

3. The substrate processing apparatus of claim 2, wherein the liquid is a rinsing liquid, and the wet processor executes a rinsing as the wet processing.

4. The substrate processing apparatus of claim 1, wherein the liquid layer forming section includes a first liquid supplier which supplies the liquid toward the surface of the substrate to form the liquid puddle layer on the entire surface of the substrate, before the opposed surface of the proximity member is positioned away from the surface of the substrate and the liquid-tight layer is formed in the gap space.

5. The substrate processing apparatus of claim 4, wherein the first liquid supplier includes a first nozzle which discharges the liquid toward the surface of the substrate.

6. The substrate processing apparatus of claim 1, further comprising:

a second liquid supplier which, while the proximity member relatively moves, supplies the liquid toward a downstream-side surface of the substrate relative to the upstream-side end portion of the liquid-tight layer in the moving direction.

7. The substrate processing apparatus of claim 6, wherein the second liquid supplier includes a second nozzle which discharges the liquid to a non-opposed surface of the proximity member which is exclusive of the opposed surface, and the proximity member guides the liquid discharged to the non-opposed surface from the second nozzle, along the non-opposed surface, toward an upstream side which is located at the upstream in the moving direction among sides defining the opposed surface.

8. The substrate processing apparatus of claim 7, wherein the proximity member guides the liquid discharged to the non-opposed surface from the second nozzle, along the non-opposed surface, toward the upstream side and toward a downstream side which is located at the downstream in the moving direction among sides defining the opposed surface.

9. The substrate processing apparatus of claim 7, wherein, and the proximity member guides the liquid discharged from the second nozzle toward the upstream side via the extending surface.

10. The substrate processing apparatus of claim 9, wherein the proximity member further includes a guide surface which faces the extending surface and guides the liquid to the upstream side, and the proximity member guides the liquid toward the upstream side while filling up a clearance with the liquid discharged from the second nozzle in a liquid-tight state, the clearance being a gap between the extending surface and the guide surface.

11. The substrate processing apparatus of claim 1, wherein the solvent gas supplier includes a cover member which surrounds an upstream-side atmosphere which is located at an upstream relative to the liquid-tight layer in the moving direction, and the solvent gas supplier supplies the solvent gas to the upstream-side atmosphere.

12. The substrate processing apparatus of claim 1, wherein the proximity member further includes an upstream-side opposed section which has a gas discharge outlet and is positioned facing the surface of the substrate and away therefrom at an upstream relative to the opposed surface in the moving direction, and the solvent gas supplier discharges the solvent gas from the gas discharge outlet toward an upstream of the liquid-tight layer in the moving direction.

13. A substrate processing apparatus which dries a surface of a disk-shaped substrate which is wet with a liquid, the apparatus comprising:

a proximity member made of quartz, which includes an opposed surface facing the surface of the substrate and which is structured to move freely and relatively in a predetermined moving direction relative to the substrate in a condition that the opposed surface is positioned away from the surface of the substrate and that a gap space between the opposed surface and the surface of the substrate is filled up with the liquid to form a liquid-tight layer;

wherein the proximity member has the shape of a right prism and is substantially trapezoidal in its vertical cross-section, including an extending surface which is connected with an upstream side which is one of sides defining the opposed surface and which is located on the upstream side of the proximity member in the moving direction, and which extends inclined from the upstream side in a direction away from the substrate surface overlooking the upstream side in the moving direction; and wherein a length of the proximity member in a direction orthogonal to the moving direction is at least as great as a diameter of the disk-shaped substrate;

wherein the proximity member forms an interface of the liquid-tight layer at the upstream side, contained between the upstream side and the surface of the substrate;

a driver which relatively moves the proximity member in the moving direction relative to the substrate;

a solvent gas supplier which supplies a solvent gas which is one of IPA, ethyl alcohol and methyl alcohol toward an upstream-side end portion of the liquid-tight layer in the moving direction, the solvent gas containing a solvent component which dissolves in the liquid to reduce a surface tension;

wherein the solvent gas supplier includes a gas nozzle which is disposed in a space above the upstream-side end portion of the proximity member, and which discharges the solvent gas from above so as to supply the solvent gas toward the upstream-side end portion of the proximity member, the solvent gas being guided at least partly along the extending surface of the proximity member; and a liquid layer forming section which forms a liquid puddle layer on an entire downstream-side surface of the substrate relative to the upstream-side end portion of the liquid-tight layer in the moving direction;

at the upstream-side end portion of the proximity member, the opposed surface and the extending surface are at an acute angle, so as to form a meniscus between the vicinity of the upstream side of the proximity member and the substrate, thereby maintaining a gas-liquid-solid interface on the surface of the substrate in the vicinity of the upstream side; and a liquid supplier which, while the proximity member relatively moves, supplies the liquid toward the downstream-side surface of the substrate relative to the upstream-side end portion of the liquid-tight layer in the moving direction, thereby maintaining the puddle-like liquid layer on the entire downstream-side surface of the substrate relative to the upstream-side end portion of the liquid-tight layer.

14. The substrate processing apparatus of claim 13, wherein
the liquid layer forming section includes a wet processor which executes a predetermined wet processing to the surface of the substrate with the liquid and forms the liquid puddle layer on an entire surface of the substrate after the execution of the wet processing, and wherein
the opposed surface of the proximity member is positioned away from the surface of the substrate and the liquid-tight layer is formed in the gap space, after the liquid puddle layer is formed on the entire surface of the substrate.

15. The substrate processing apparatus of claim 14, wherein the liquid is a rinsing liquid, and the wet processor executes a rinsing as the wet processing.

16. The substrate processing apparatus of claim 13, wherein
the liquid layer forming section includes a first liquid supplier which supplies the liquid toward the surface of the substrate to form the liquid puddle layer on the entire surface of the substrate, before the opposed surface of the proximity member is positioned away from the surface of the substrate and the liquid-tight layer is formed in the gap space.

17. The substrate processing apparatus of claim 16, wherein the first liquid supplier includes a first nozzle which discharges the liquid toward the surface of the substrate.

* * * * *